(12) United States Patent
Takeuchi

(10) Patent No.: US 7,672,406 B2
(45) Date of Patent: Mar. 2, 2010

(54) CLOCK AND DATA RECOVERY CIRCUIT AND SERDES CIRCUIT

(75) Inventor: Masahiro Takeuchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 658 days.

(21) Appl. No.: 11/649,314

(22) Filed: Jan. 4, 2007

(65) Prior Publication Data

US 2007/0160173 A1 Jul. 12, 2007

(30) Foreign Application Priority Data

Jan. 10, 2006 (JP) ............................. 2006-002692

(51) Int. Cl.
- *H04L 27/08* (2006.01)
- *H04L 7/00* (2006.01)

(52) U.S. Cl. ...................................... 375/345; 375/355

(58) Field of Classification Search ................. 375/345, 375/355, 373, 374; 327/247, 231, 234, 361; 455/130, 160

See application file for complete search history.

(56) References Cited

U.S. PATENT DOCUMENTS

| | | | |
|---|---|---|---|
| 7,349,506 B2 * | 3/2008 | Shizuki ....................... | 375/350 |
| 2002/0079938 A1 | 6/2002 | Saeki | |
| 2004/0022339 A1 * | 2/2004 | Nakao ......................... | 375/376 |
| 2004/0170244 A1 | 9/2004 | Cranford, Jr. et al. | |
| 2004/0252804 A1 | 12/2004 | Aoyama | |

FOREIGN PATENT DOCUMENTS

| | | |
|---|---|---|
| JP | 2002-190724 | 7/2002 |
| JP | 2005-005999 | 1/2005 |

\* cited by examiner

*Primary Examiner*—Khai Tran
(74) *Attorney, Agent, or Firm*—Foley & Lardner LLP

(57) ABSTRACT

Disclosed is a clock-and-data recover circuit in which a data sampling circuit, a phase comparator, a phase controller and a phase interpolator make up a loop. The data sampling circuit samples serial input data, and the phase comparator receives an output from the data sampling circuit to detect the phase relationship between clock and the data. The phase controller outputs a phase control signal based on the result of phase comparison of the phase comparator to output a phase control signal. The phase interpolator receives a multi-phase clock composed of plural clock signals with different phases and supplies a clock signal having the phase interpolated based on the phase control signal, to the data sampling circuit. The clock and data recovery circuit further includes a second phase interpolator and a second data sampling circuit. The phase controller generates and outputs a second phase control signal to the second phase interpolator. The second phase interpolator receives the multi-phase clock and outputs a second clock signal having the phase interpolated based on the second phase control signal and supplies the second clock signal to the second data sampling circuit. The second data sampling circuit samples the input data based on the second clock signal from the second phase interpolator. Preferably, the second phase interpolator has a variably set threshold level for sampling the data.

21 Claims, 19 Drawing Sheets

CLOCK AND DATA RECOVERY CIRCUIT AND SERDES CIRCUIT

FIELD OF THE INVENTION

This invention relates to a SERDES (SERializer and DESerializer) circuit for high-speed serial data transfer between LSIs (Large Scale Integrated Circuits). More particularly, this invention relates to a circuit suitably employed for measuring an operational margin of a clock and data recovery circuit.

BACKGROUND OF THE INVENTION

With recent development of the semiconductor technology, the data transfer between LSIs has become to be performed by high-speed serial transmission. As an interface for converting transmit parallel data to serial data, outputting the serial data over a transmission line, and converting received serial data into parallel data, a circuit termed SERDES (SERializer and DESerializer) has come into wide spread use. This SERDES circuit will now be described with reference to FIG. 1. The SERDES includes a PLL (Phase Locked Loop) circuit 10 for generating an internal clock signal, a transmit circuit 11, and a receive circuit 12, as shown in FIG. 1.

The transmit circuit 11 includes a parallel-to-serial converting circuit 13 for serializing parallel data. The receive circuit 12 includes a clock and data recovery circuit 14 for extracting a clock synchronized with the received serial data from the data and for outputting the extracted clock signal (recovery clock) and the data, and a serial-to-parallel converting circuit 15 for converting the data into parallel data.

FIG. 19 shows an illustrative configuration of a clock and data recovery circuit described in Patent Document 1 of the present Assignee. Referring to FIG. 19, this clock and data recovery circuit includes a phase detector 201, integrators 202 and 203, a pattern generator 204, a mixer 205 and a phase interpolator 206. The phase detector 201 detects the phase relationship between input data and an extracted clock. A block made up of the integrators 202 and 203, pattern generator 204 and the mixer 205 generates a phase control signal for the phase interpolator. The phase interpolator 206 generates the extracted clock. The above-described loop takes charge of recovery of the clock and the data. As for the configuration of the clock and data recovery circuit, reference is made to, for example, the disclosure of Patent Document 2.

[Patent Document 1]
  Japanese Patent Kokai Publication No. JP-P2005-5999A

[Patent Document 2]
  Japanese Patent Kokai Publication No. JP-P2002-190724A

SUMMARY OF THE DISCLOSURE

Meanwhile, in the conventional clock and data recovery circuit, disclosed in, for example, the Patent Document 1 or 2, there is not implemented the function of determining whether or not the recovered clock, extracted from the serial input data, is truly optimum, or whether or not a sufficient operational margin is provided along the temporal and voltage directions.

That is, the present inventors have recognized that it is essential to implement a circuit whereby it is possible to measure the magnitude of the operational margin of the clock and data recovery circuit.

For solving the above problem, the invention disclosed in the present application may be summarized substantially as follows:

In one aspect, the present invention provides a clock and data recovery circuit comprising a data sampling circuit, a phase comparator, a phase controller, a phase interpolator, and a control circuit. The data sampling circuit receives an input data signal and samples the received input data signal responsive to a clock signal. The phase comparator receives the data signal sampled by the data sampling circuit to detect the phase relationship between the clock signal and the data signal. The phase controller outputs a phase control signal based on the result of phase comparison by the phase comparator. The phase interpolator outputs a clock signal phase-interpolated based on the phase control signal. The clock signal output from the phase interpolator is supplied to the data sampling circuit to form a loop. The clock and data recovery circuit further includes a control circuit that controls the phase control signal from outside the loop in order to exercise control for variably setting the phase of the clock signal supplied to the data sampling circuit and/or control for variably setting a threshold level in the data sampling circuit.

In another aspect, the present invention provides a clock and data recovery circuit comprising a data sampling circuit, a phase comparator, a phase controller, and a phase interpolator. The data sampling circuit receives an input data signal and samples the received input data signal responsive to a clock signal. The phase comparator receives the data signal sampled by the data sampling circuit and detects the phase relationship between the clock signal and the data signal. The phase controller outputs a phase control signal based on the result of phase comparison by the phase comparator. The phase interpolator generates a clock signal phase-interpolated based on the phase control signal. The clock signal output from the phase interpolator is supplied to the data sampling circuit. The data sampling circuit, phase comparator, phase controller and the phase interpolator make up a loop. The phase controller generates a phase control signal distinct from the phase control signal. The clock and data recovery circuit further comprises another phase interpolator for receiving the distinct phase control signal, output from the phase controller, to generate a clock signal phase-interpolated based on the distinct phase control signal, and another data sampling circuit for sampling the input data based on the clock signal from the other phase interpolator.

According to the present invention, the threshold level of the other data sampling circuit in sampling the input signal is variably set.

The clock and data recovery circuit according to the present invention may further comprise a test control circuit for generating a signal prescribing a phase offset. The phase controller may shift the phase control signal by an amount corresponding to the phase offset to generate the distinct phase control signal.

The clock and data recovery circuit according to the present invention may further comprise a test control circuit for generating a phase control signal for test. The phase controller may generate the phase control signal and/or the distinct phase control signal from the phase control signal for test.

In another aspect, the present invention provides a clock and data recovery circuit comprising first and second data sampling circuits, a phase comparator, a phase controller, a phase interpolator, a test control circuit, a threshold voltage generating circuit and a second phase interpolator. The first and second data sampling circuits receive an input data signal and sample the input data signal responsive to first and second clock signals. The phase comparator receives the data signal sampled by the first data sampling circuit to detect the phase relationship between the first clock signal and the data signal. The phase controller receives the result of phase comparison by the phase comparator to output a first phase control signal. The phase interpolator receives a multi-phase clock composed of a plurality of clock signals having phases spaced each another and transmits a clock phase-interpolated responsive to the first phase control signal to the first data sampling circuit, as the first clock signal. The test control circuit outputs a phase offset signal supplied, to the phase controller, and generates a threshold voltage control signal which variably controls the threshold voltage. The threshold voltage generating circuit generates a threshold voltage responsive to the threshold voltage control signal. The second phase interpolator receives the multi-phase clock and a second phase control signal from the phase controller to transmit a clock phase-interpolated responsive to the second phase control signal as the second clock signal to the data sampling circuit. The second data sampling circuit has its threshold level variably set. The clock and data recovery circuit further comprises a first selection circuit and an error detection circuit. The first selection circuit selects data output from the first data sampling circuit or data output from the second data sampling circuit and outputs the selected data. The error detection circuit receives the data selected by the first selection circuit to detect errors in the data.

According to the present invention, as a loop made up of the first data sampling circuit, phase comparator, phase controller and the phase interpolator is in operation, it is checked by the error detection circuit whether or not data has been correctly sampled by the second data sampling circuit, for variable combinations of the phases between the first and second clock signals, output by the first and second phase interpolators, respectively, and the threshold levels. An eye pattern representing the operational margin for the clock and data recovery circuit is plotted to enable measurement of the operational margin of the loop along the temporal direction and along the amplitude direction.

The clock and data recovery circuit according to the present invention further comprises a comparator, in place of the first selection circuit and the error detection circuit. The comparator receives the first and second data output from the first and second data sampling circuits, respectively, and compares the received first and second data to each other in order to determine whether or not these first and second data coincide with one another.

The clock and data recovery circuit according to the present invention further comprises a second selection circuit for selecting the first clock signal or the second clock signal. The test control circuit receives the result of error detection from the error detection circuit and the phase control signal and generates a signal controlling the selection in the first and second selection circuits.

According to the present invention, the test control circuit may output a phase control signal for test. The phase controller may include a counter for counting up or down based on a signal representing the result of comparison from the phase comparator, and a selection circuit for selecting an output of the counter or the phase control signal for test, based on the selection control signal from the test control circuit, and for outputting the signal, thus selected, as the first phase control signal. The phase controller may also include an adder for summing the counter output and the phase offset signal together, and a selection circuit for selecting an output of the adder or the phase control signal for test, based on a selection control signal from the test control circuit, and for outputting the selected signal as the second phase control signal.

In a further aspect, the present invention provides a clock and data recovery circuit comprising a data sampling circuit, a phase comparator, a phase controller, a phase interpolator, and a test control circuit. The data sampling circuit receives an input data signal and samples the received signal responsive to a clock signal. The phase comparator receives the data signal sampled by the data sampling circuit and detects the phase relationships between the clock signal and the data signal. The phase controller outputs a phase control signal, and the phase interpolator outputs a clock signal, having its phase interpolated based on the phase control signal from the phase controller. The clock signal, output from the phase interpolator, is supplied to the data sampling circuit to form a loop. The test control circuit generates a phase control signal for test. The phase controller may include a selection circuit that selects a phase control signal generated based on a signal representing the result of comparison by the phase comparator or the phase control signal for test, and outputs the signal selected as the phase control signal supplied to the phase interpolator. The clock and data recovery circuit may further comprise an error detection circuit that receives the data output from the data sampling circuit to detect errors in the data.

According to the present invention, the clock and data recovery circuit may further comprise a threshold voltage generator for receiving a threshold voltage control signal variably controlling a threshold voltage. The threshold voltage control signal is output from the test control circuit. The threshold voltage generator variably outputs a threshold voltage. The data sampling circuit samples input data with the threshold voltage from the threshold voltage generator as a threshold level.

According to the present invention, the phase controller may include a counter for counting up or down based on the signal representing the result of comparison by the phase comparator, and a selection circuit for selecting an output of the counter or the phase control signal for test based on a selection control signal from the test control circuit.

According to the present invention, the error detection circuit may detect the number of errors.

The clock and data recovery circuit according to the present invention may further comprise a serial-to-parallel converting circuit ahead of the error detection circuit. The error detection circuit is supplied with parallel data.

According to the present invention, the data sampling circuit may include a receiver circuit receiving the input data signal and having a threshold level variably set, and a set of latch circuits for sampling an output of the receiver circuit at different timings based on a clock signal supplied to the data sampling circuit and on an reversed-phase version of the clock signal. A plurality of series of data sampled at different timings may be supplied to the phase comparator. The phase comparator verifies the phase lead or phase lag between the clock and the data based on the status of coincidence/non-coincidence between the plural series of data supplied from the data sampling circuit.

According to the present invention, the first data sampling circuit normally samples data with a mid point of the voltage level of the serial input data as a threshold value. The second data sampling circuit may sample data, under a command from the test control circuit, with the threshold voltage output by the threshold voltage generating circuit as a threshold level.

Moreover, according to the present invention, overall control inclusive of control for the error detection circuit and the selection circuit may be managed from the test control circuit.

The operational margin of the clock and data recovery circuit may be measured by checking for possible presence of an error in the first and/or second sampling data in various combinations of control, and by plotting an eye pattern for the clock and data recovery circuit.

In yet another aspect, the present invention provides a SERDES circuit comprising a PLL circuit for generating a clock, a transmit circuit including a parallel-to-serial converting circuit for converting the parallel data into serial data to output the so generated serial data, and a receive circuit including the clock and data recovery circuit of the present invention, receiving the input serial data, and a serial-to-parallel converting circuit for converting the data and clock from the clock and data recovery circuit into parallel data. There may be provided a switching control circuit for turning an output of the transmit circuit to supply the output to the clock and data recovery circuit of the receive circuit.

The meritorious effects of the present invention are summarized as follows.

According to the present invention, the operational margin along the temporal direction and the voltage direction of the clock and data recovery circuit may be measured to advantage.

The reason is that, according to the present invention, the operational margin of the clock and data recovery circuit along the temporal and voltage directions may be measured by detecting an error in sampled data at variable points, as the phase of the extracted clock signal, output from the phase interpolator of the clock and data recovery circuit, as well as the threshold level of the data sampling circuit, sampling the input data, is varied, and by plotting an eye pattern representing the operational margin.

Also, according to the present invention, the loop of the clock and data recovery circuit is run in operation and, in this state, a clock having a phase different from one of the clock supplied to the data sampling circuit in the loop is supplied to the other data sampling circuit, while the threshold level of the other data sampling circuit is made variable. In this manner, it becomes possible to measure the operational margin of the clock and data recovery circuit along the temporal and voltage directions.

Moreover, according to the present invention, the phase of the clock signal from the phase interpolator may directly be specified from a test control circuit.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
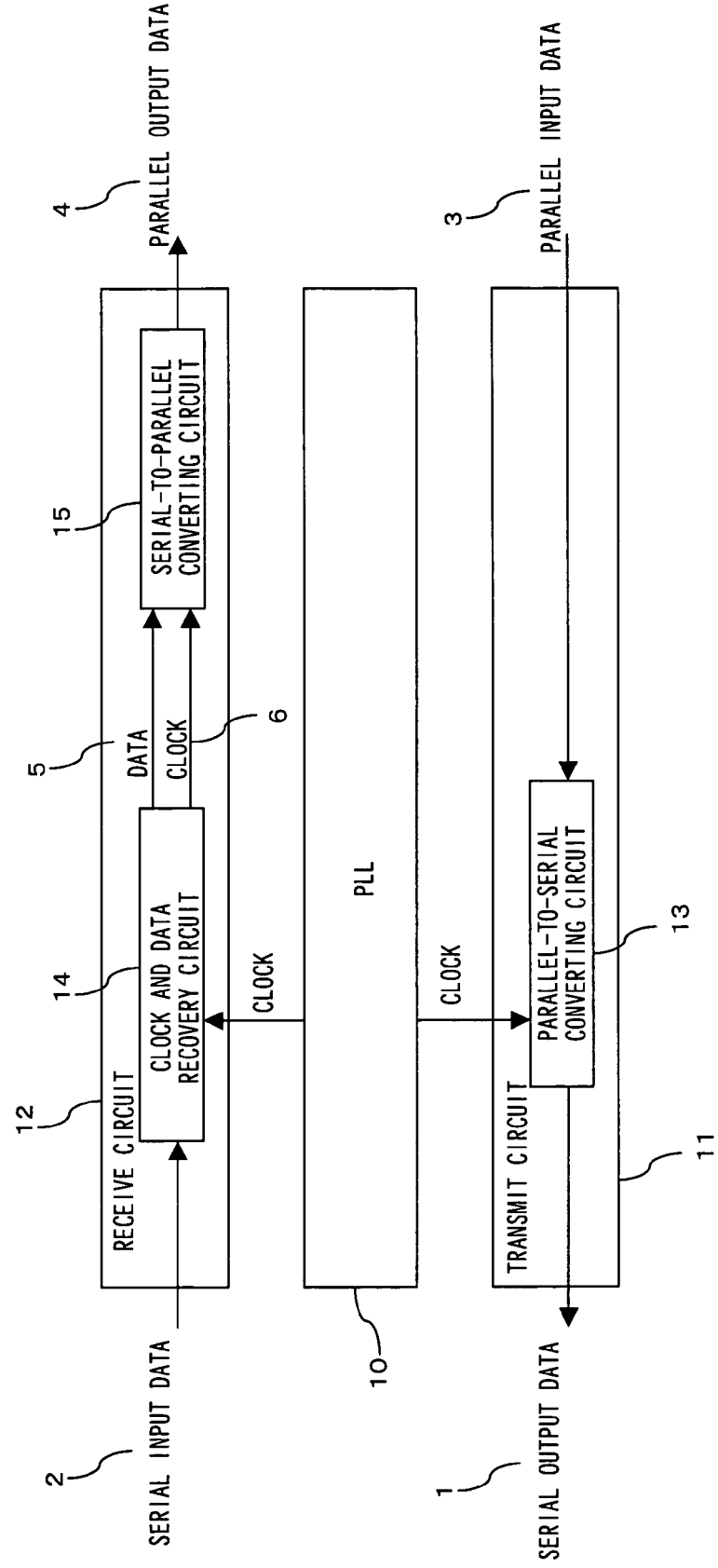
FIG. 1 is a block diagram showing the configuration of a SERDES circuit according to a first embodiment of the present invention.

The present invention will now be described in more detail with reference to the accompanying drawings. The clock and data recovery circuit according to the present invention, shown in FIG. 2 or 12, includes a data sampling circuit (101) that samples input data responsive to an extracted clock signal, a phase comparator (102) that receives the data sampled by the data sampling circuit (101) and detects the phase relationship between the clock and the data based on the so sampled data, a phase controller (103/103') that outputs a phase control signal based on the result of phase comparison (UP/DOWN) output from the phase comparator (102), a phase interpolator (104) that receives a multi-phase clock composed of plural clock signals having respective phases spaced each other, and supplies a clock signal, obtained by phase interpolation based on the phase control signal output from the phase detectors (103/103'), to the data sampling circuit (101) as an extracted clock signal. The data sampling circuit, phase comparator, phase controller and the phase interpolator constitute a loop. The phase controller (103) generates a phase control signal (phase control signal A), distinct from the aforementioned phase control signal, and supplies the distinct phase control signal to another phase interpolator (105). This other phase interpolator (105) receives the aforementioned multi-phase clock, as does the phase interpolator (104), and outputs a clock signal, obtained by interpolation in accordance with the distinct phase control signal as the aforementioned distinct phase control signal (phase control signal A). The clock and data recovery circuit further includes another data sampling circuit (106) that samples the input data based on another extraction clock (extraction clock A) supplied from the phase interpolator (105). This other data sampling circuit (106) preferably has a variably set threshold level for sampling the data. The clock and data recovery circuit further includes a selection circuit (108) that selects one of data output from the two data sampling circuits (101, 106), and an error detection circuit (110) that receives the data selected by the selection circuit (108) and detects an error in the data. According to the present invention, the clock and data recovery circuit may further include a selection circuit (109) that selects one of clock signals output from the phase interpolators (104, 105).

According to the present invention, the clock and data recovery circuit further includes a test control circuit (111), also termed a SERDES test control circuit, that outputs a phase offset signal supplied to the phase controller (103) and generates a threshold voltage control signal which variably controls the threshold voltage, and a threshold voltage generator (107) that generates a threshold voltage consistent with the threshold voltage control signal.

According to the present invention, as a loop made up of the first data sampling circuit (101), phase comparator (102), phase controller (103) and the phase interpolator (104) is in operation, it is checked by the error detection circuit (110) whether or not data has been correctly sampled by the data sampling circuit (106), for variable combinations of the phases between first and second clock signals output by the first and second phase interpolators (104, 105), respectively, and the threshold levels in the data sampling circuit (106). An eye pattern representing the operational margin for the clock and data recovery circuit is plotted to enable measurement of the operational margin of the loop along the temporal direction and along the amplitude direction.

According to the present invention, the clock and data recovery circuit may include a comparator (120 of FIG. 15) that receives data output from the data sampling circuits (101, 106), respectively, and compares the received data to each other in order to determine whether or not these data coincide with one another.

According to the present invention, the test control circuit (111) may manage the selection in the selection circuits (108, 109) adapted for selecting data or the extracted clock, or may generate a threshold value control signal, responsive to the result of error detection from the error detection circuit (110) or to the phase control signal. The threshold value control signal is used for variably setting the phase offset signal, phase control signal for test or the threshold voltage in the threshold voltage generator (107).

According to the present invention, the phase controller (103) may include a counter (103A) that counts up or counting down an output signal of the result of comparison of the phase comparator (102), and a selection circuit (103C). This selection circuit selects an output of the counter (103A) or a phase control signal for test, based on a selection control signal from the test control circuit (111), and supplies the so selected signal as the aforementioned phase control signal to the phase interpolator (104). The phase controller may also include an adder (103B) for adding an output of the counter (103A) and a phase offset signal, and a selection circuit (103D) that selects an output of the adder (103B) or the phase control signal for test, based on the selection control signal from the test control circuit (111), and supplies the selected signal as distinct phase control signal (phase control signal A) to the phase interpolator (105).

Figure 13:
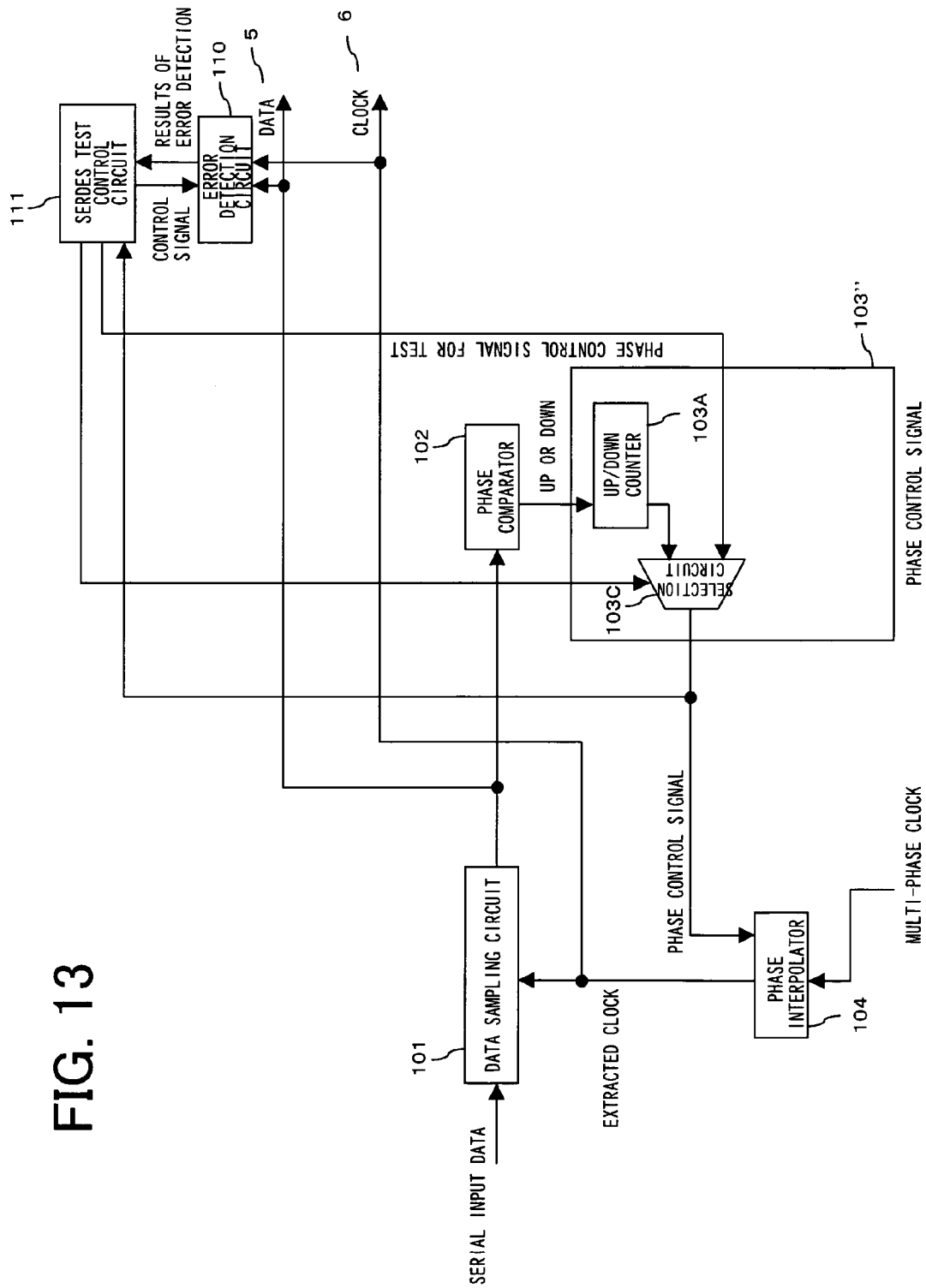
FIG. 13 is a block circuit diagram showing the configuration of a clock and data recovery circuit according to a fifth embodiment of the present invention.

According to the present invention, in FIG. 13, a clock and data recovery circuit includes a data sampling circuit (101) that samples input data, and a phase comparator (102) that receives input data from the data sampling circuit (101) and detects the phase relationships between the clock and the data, based on the received input data. The clock and data recovery circuit also includes a phase controller (103") that outputs a phase control signal, and a phase interpolator (104). The phase interpolator receives a multi-phase clock, composed of a plural number of clock signals, having respective phases spaced each other, and supplies the clock signal, phase-interpolated based on the phase control signal, to the aforementioned data sampling circuit. Output data from the data sampling circuit (101) and the clock signals from the phase interpolator (104) are output as recovered data signal and clock signal, respectively. The clock and data recovery circuit also includes a test control circuit (111) for generating a phase control signal for test supplied to the phase interpolator (104). The phase controller (103") selects and outputs a phase control signal generated based on a signal representing the result of comparison by the phase comparator (102) or the phase control signal for test, generated by the test control circuit (111), and for outputting the selected signal as the phase control signal to be supplied to the phase interpolator (104). The clock and data recovery circuit further includes an error detection circuit (110) that receives data output from the data sampling circuit (101) and detects a possible error in the data.

Figure 14:
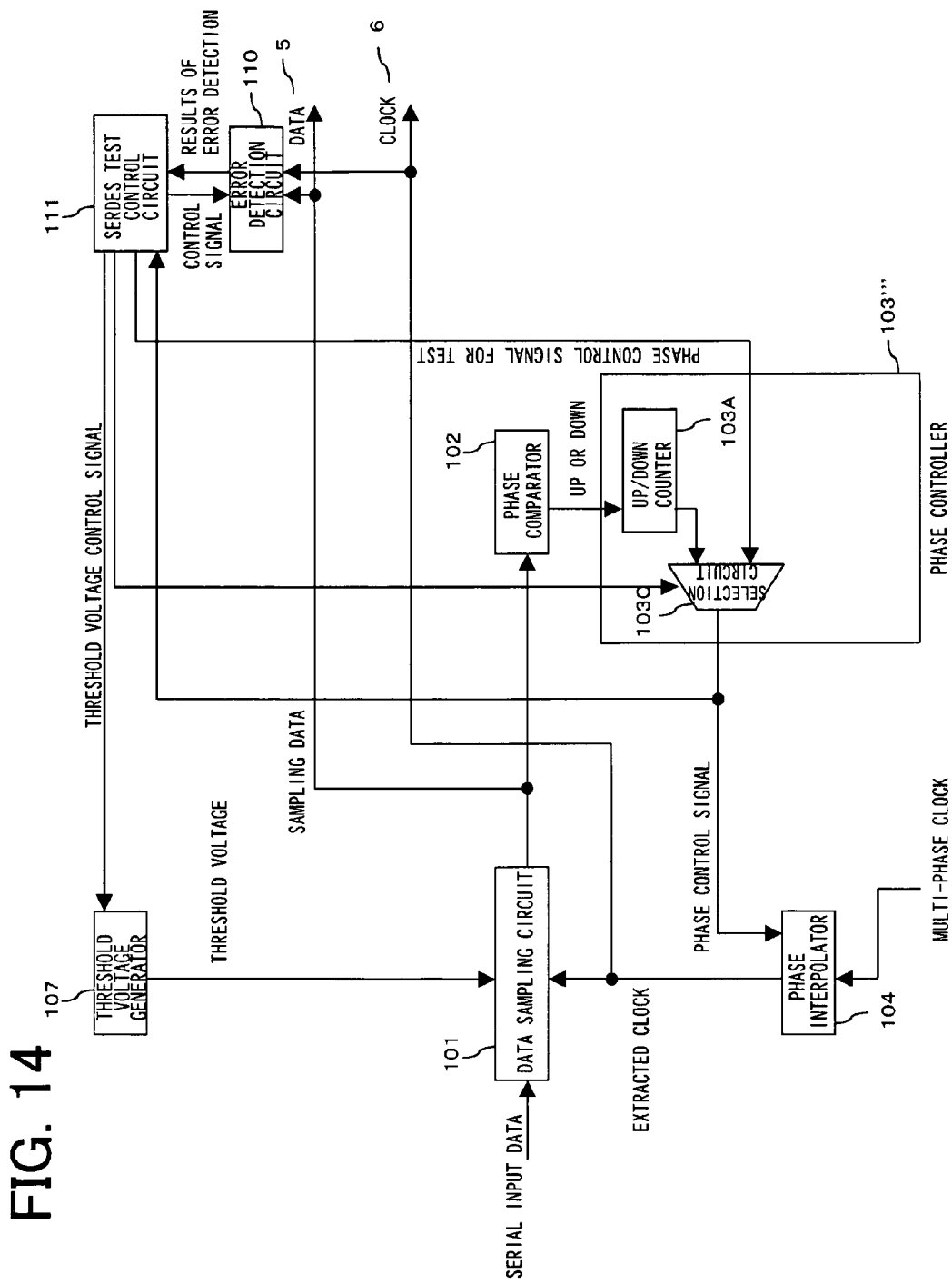
FIG. 14 is a block circuit diagram showing the configuration of a clock and data recovery circuit according to a sixth embodiment of the present invention.

The clock and data recovery circuit according to the present invention includes, a threshold voltage generator (107) that receives a threshold voltage control signal which variably controls a threshold voltage, output by the test control circuit (111), as shown in FIG. 14. The threshold voltage generator variably outputs a threshold voltage. The data sampling circuit (101) samples input data with the threshold voltage consistent with the threshold voltage from the threshold voltage generator (107) as a threshold level.

According to the present invention, the phase controller includes a counter (103A) that counts up or down based on the signal representing the result of comparison by the phase comparator (102), and a selection circuit (103C) that selects an output of the counter (103A) or the phase control signal for test and outputs the so selected signal as phase control signal to the phase interpolator (104).

According to the present invention, the error detection circuit (110) may detect the number of errors.

Figure 11:
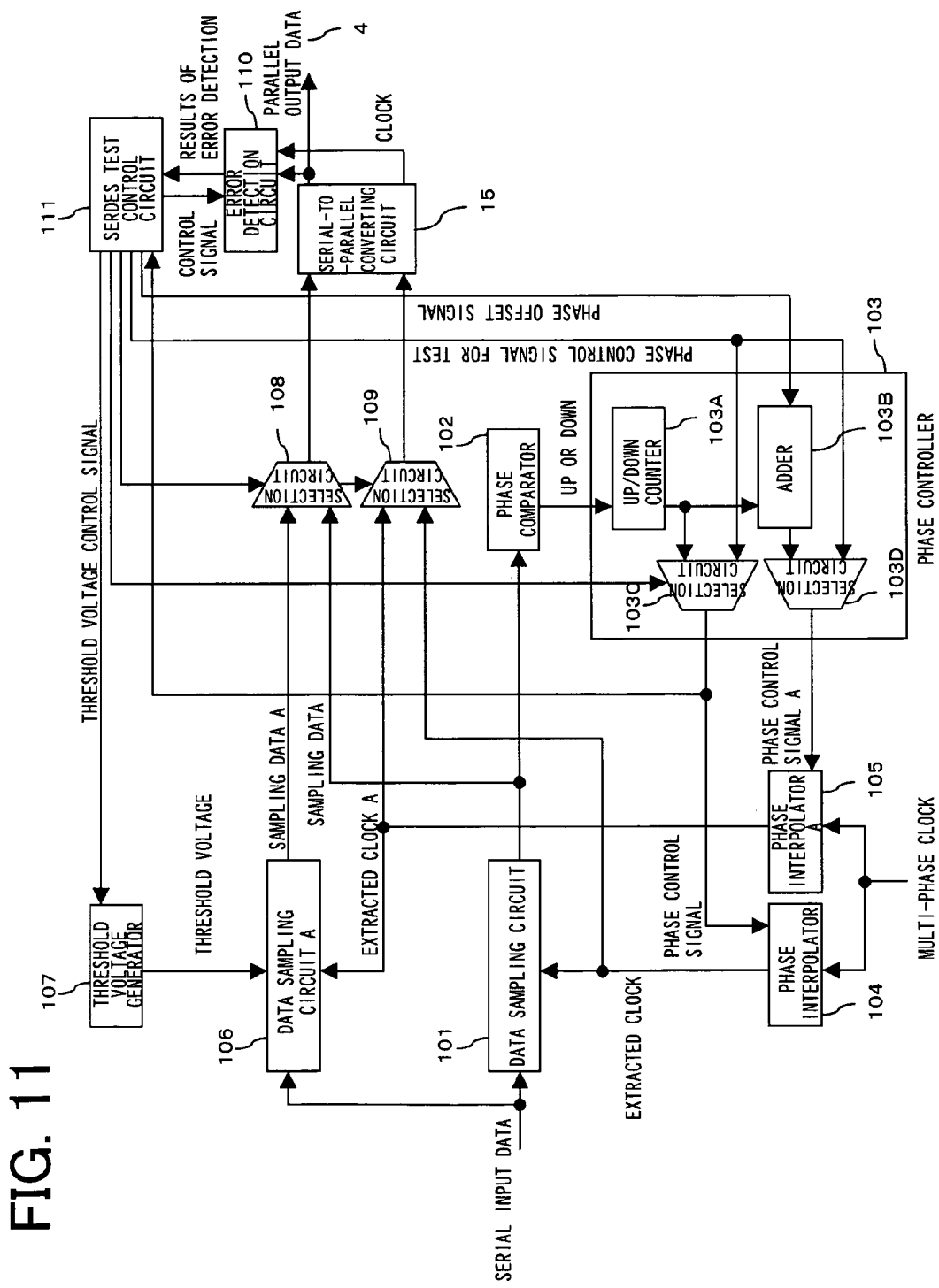
FIG. 11 is a block circuit diagram showing the configuration of a clock and data recovery circuit according to a third embodiment of the present invention.

According to the present invention, a serial-to-parallel converting circuit (115) may be provided ahead of the error detection circuit (110) to transmit parallel data to the error detection circuit (110), as shown in FIG. 11.

According to the present invention, a SERDES interface includes, as a deserializer part, a clock and data recovery circuit (14) that is supplied with the received serial input data, and a serial-to-parallel converting circuit (15) that receives the data and the clock signal from the clock and data recovery circuit and converts the serial data into parallel data, as shown in FIG. 1. The clock and data recovery circuit (14) is the clock and data recovery circuit according to the present invention. During testing, an output of the transmit circuit (11) may be turned back and supplied to the clock and data recovery circuit (14) in a switched configuration to allow for a loopback test. The embodiments of the present invention will now be described in detail.

FIG. 1 is a block diagram illustrating the overall configuration of a SERDES circuit according to an embodiment of the present invention. Referring to FIG. 1, the SERDES circuit includes a PLL circuit 10, a transmit circuit 11 and a receive circuit 12. The transmit circuit 11 includes a parallel-to-serial converting circuit 13 for serializing parallel data 3 to generate output serial data 1. The receive circuit 12 includes a clock and data recovery circuit 14 for recovering a clock, synchronized with input serial data 2, from the input serial data 2 and from a clock generated by the PLL circuit 10. The input serial data is supplied from outside. The receive circuit 12 also includes a serial-to-parallel converting circuit 15 for converting data 5 and a clock 6 into parallel data. A multiphase clock generating circuit, not shown, generates a multiphase clock signals having phases equally spaced, such as by dividing a clock supplied thereto from a PLL circuit 10, to provide the so generated multi-phase clock signals to the clock and data recovery circuit 14.

Figure 2:
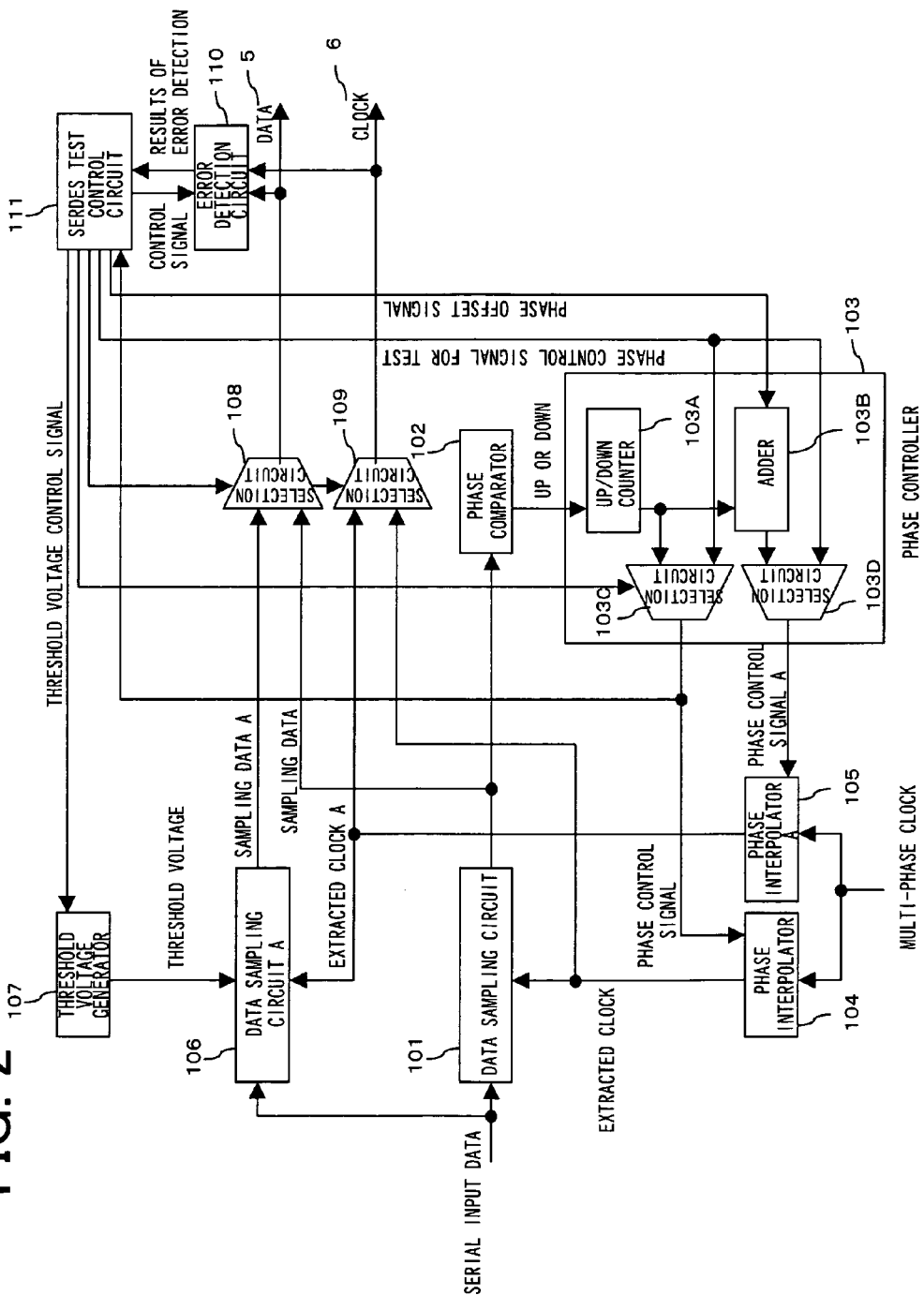
FIG. 2 is a circuit diagram showing the configuration of a clock and data recovery circuit according to the first embodiment of the present invention.

FIG. 2 is a circuit diagram showing the configuration of a clock and data recovery circuit (14 of FIG. 1 or 14 of FIG. 10 as later described) according to an embodiment (first embodiment) of the present invention. Referring to FIG. 2, the clock and data recovery circuit includes a data sampling circuit 101, a phase comparator 102, a phase controller 103, a phase interpolator 104, a phase interpolator A 105, a data sampling circuit A 106, a threshold voltage generator 107, selection circuits 108 and 109, an error detection circuit 110 and a SERDES test control circuit 111.

The data sampling circuit 101 samples data, responsive to an edge of an extracted clock signal to output the so sampled data.

Figure 3:
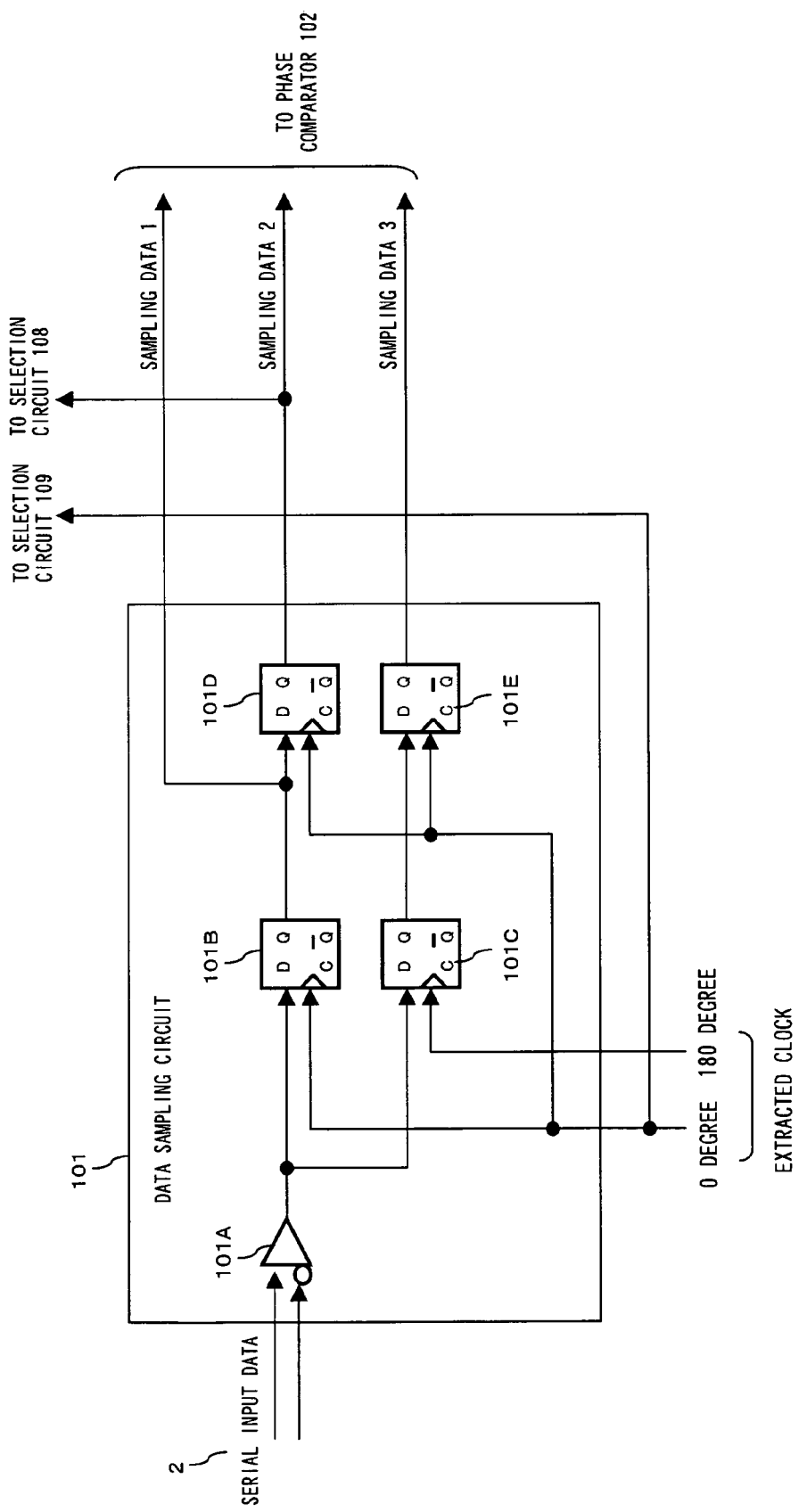
FIG. 3 is a circuit diagram showing the configuration of a data sampling circuit according to the first embodiment of the present invention.

In case the input serial data is a differential signal, the data sampling circuit 101 includes a differential amplifier (receiver) 101A and flip-flops 101B to 101E for sampling an output of the differential amplifier (receiver) 101A, as shown in FIG. 3. In case the serial input data is a single-ended signal, the center-level voltage of the serial data input signal is supplied, by way of a reference voltage (Vref), not shown, as one of a pair of input signals of the differential amplifier 101A.

Referring again to FIG. 2, the phase comparator 102 detects the phase relationships between the extracted clock signal and the serial input data, based on a data signal sampled by the data sampling circuit 101, in order to give a decision as to whether or not the extracted clock signal is to have a phase lead or a phase lag. If, as a result of the decision, the extracted clock signal is to have a phase lead, the phase comparator outputs an UP signal. If conversely the extracted clock signal is to have a phase lag, the phase comparator outputs a DOWN signal.

The phase controller 103 includes an up/down counter 103A, an adder 103B, a selection circuit 103C and a selection circuit 103D. The up/down counter 103A integrates the UP and DOWN signals, and the adder 103B adds a phase offset to an output of the up/down counter 103A. The selection circuit 103C selects an output signal of the up/down counter 103A or a phase control signal for test output from the SERDES test control circuit 111. The selection circuit 103D selects an output signal of the adder 103B or the phase control signal for test output from the SERDES test control circuit 111. The selection circuits 103C and 103D receive a selection control signal from the SERDES test control circuit 111 to select one of the two signals in accordance with the selection control signal received.

The UP and DOWN signals, output from the phase comparator 102, are changed frequently and, if these signals are directly used as control signals for the phase interpolator 104, the phase of the extracted clock signal will be moved frequently. Hence, the up/down counter 103A, operating as an integrator, is used to prevent the phase of the extracted clock signal from being moved frequently.

The phase control signal, output from the selection circuit 103C, controls the phase of the phase interpolator 104.

The phase control signal A, output from the selection circuit 103D, controls the phase of the phase interpolator A 105.

The phase interpolator 104 causes the phase of the extracted clock signal to lead or lag in accordance with the phase control signal.

The phase interpolator A 105 causes the phase of the extracted clock signal to lead or lag in accordance with the phase control signal A.

In the present embodiment, the phase control signal is supplied to the SERDES test control circuit 111, although this is not intended to limit the present invention. By such configuration, it becomes possible for the SERDES test control circuit 111 to confirm the value of the phase control signal.

The threshold voltage generator 107 is responsive to a command from the SERDES test control circuit 111 to generate a threshold voltage value.

The data sampling circuit A 106 samples serial input data, responsive to an extracted clock signal A, with the threshold value as a threshold level, to output sampled data A.

The selection circuit 108 selects the sampled data, output from the data sampling circuit 101, or the sampled data A, output from the data sampling circuit A 106. The data selected and output by the selection circuit 108 becomes an output data signal 5 of the clock and data recovery circuit.

The selection circuit 109 selects an extracted clock signal, output from the phase interpolator 104, or an extracted clock signal A, output from the phase interpolator A 105. The clock selected and output by the selection circuit 109 becomes an output clock signal 6 of the clock and data recovery circuit.

The error detection circuit 110 is responsive to a control signal from the SERDES test control circuit 111 to detect the possible presence of an error in the data signal 5, output from the selection circuit 108, to output the result of detection to the SERDES test control circuit. The error detection circuit 110 receives the clock signal 6 output from the selection circuit 109. During testing, the error detection circuit 110 may compare the data signal 5 with its expected value to check for the possible presence of an error.

The SERDES test control circuit 111 manages comprehensive control of the clock and data recovery circuit. Specifically, the SERDES test control circuit receives the results of error detection from the error detection circuit 110 and the phase control signal from the phase controller 103, and supplies a control signal to the error detection circuit 110, while supplying a threshold voltage control signal to the threshold voltage generator 107. The SERDES test control circuit also supplies the phase control signal for test and the phase offset signal to the phase controller 103, while supplying selection control signals to the selection circuits 103C, 103D, 108 and 109.

The operation of the clock and data recovery circuit of the present embodiment, shown in FIG. 2, will now be described in detail.

The data sampling circuit 101 samples the input serial data by the extracted clock signal output from the phase interpolator 104.

FIG. 3 shows an illustrative configuration of the data sampling circuit 101. This data sampling circuit includes a receiver 101A, D-type flip-flops 110B, 110C, 101D and 101E. The receiver 101A is differentially supplied with serial data. The D-type flip-flops 101B and 101C sample an output of the receiver 101A responsive to rising edges of a 0 degree extracted clock signal and a 180 degree extracted clock signal (complementary clock signals), respectively. The D-type flip-flops 101D and 101E sample respective outputs of the D-type flip-flops 101B and 101C, responsive to a rising edge of the 0 degree extracted clock signal. Output signals of the D-type flip-flops 101B, 101D and 101E are output as sampled data 1, 2 and 3, respectively. The sampled data 2 is also supplied to the selection circuit 108. The 0 degree extracted clock signal is also supplied to the selection circuit 109. The three sampled data 1, 2 and 3 are all supplied to the phase comparator 102.

Figure 4:
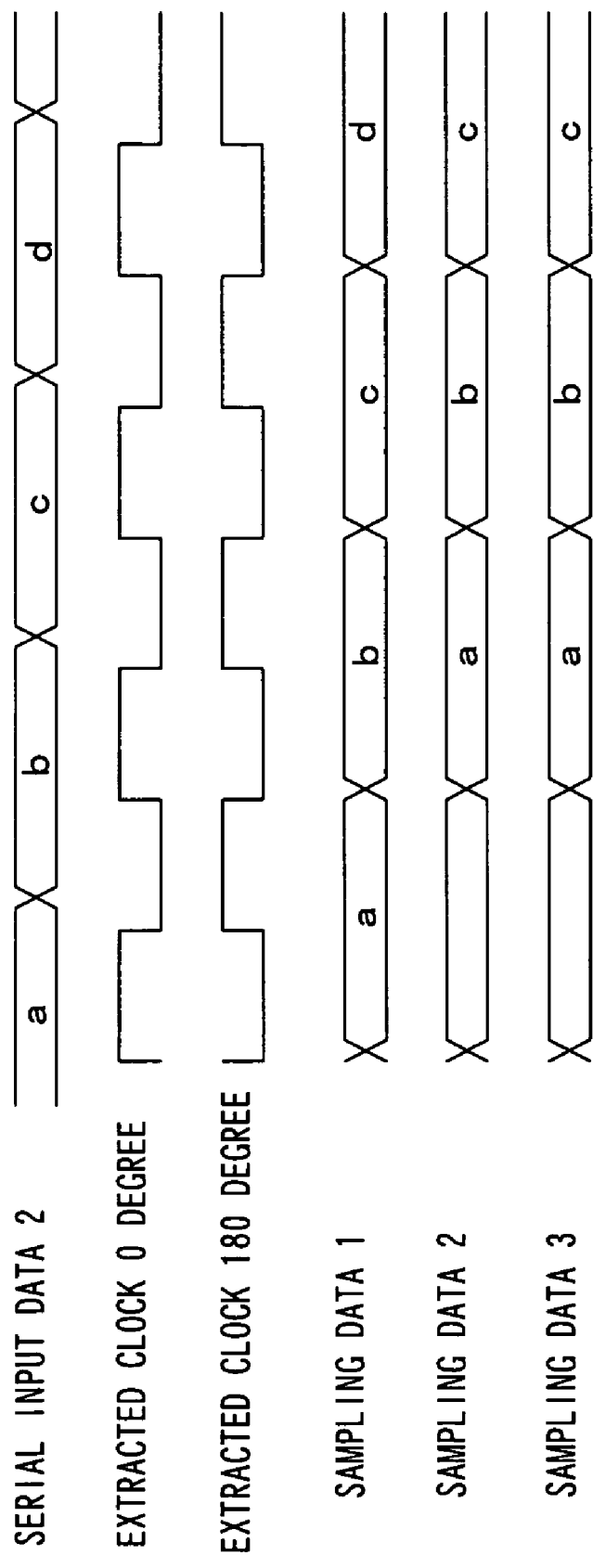
FIG. 4 is a timing chart for illustrating the operation of the data sampling circuit according to the first embodiment of the present invention.
Figure 5:
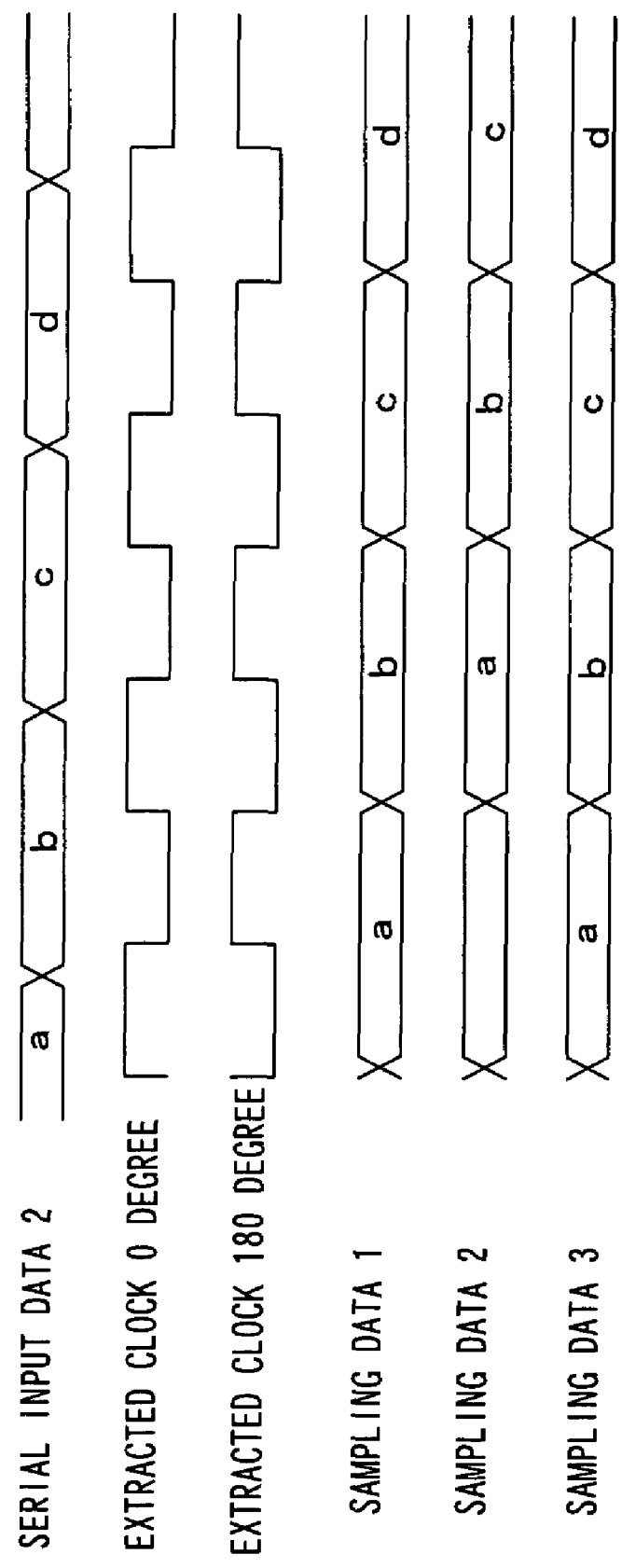
FIG. 5 is a timing chart for illustrating the operation of the data sampling circuit according to the first embodiment of the present invention.

Examples of the timing operation of the circuit of FIG. 3 are shown in FIGS. 4 and 5. FIG. 4 shows an example in which the phase of the extracted clock signal is advanced slightly with respect to the input serial data 2, and FIG. 5 shows an example in which the phase of the extracted clock signal is delayed slightly with respect to the input serial data 2.

In the timing chart of FIG. 4, the sampled data 2 and the sampled data 3 are the same at all times.

On the other hand, in the timing chart of FIG. 5, the sampled data 1 and the sampled data 3 are the same at all times.

The phase comparator 102 detects the phase relationships between the extracted clock signal and the serial input data, based on data sampled by the data sampling circuit 101, in order to give a decision whether the phase of the extracted clock signal is to be advanced or delayed.

In the timing chart shown in FIG. 4, the sampled data 2 and the sampled data 3 are the same at all times. However, in case the serial data input pattern has transitioned from the LOW level to the HIGH level or from the HIGH level to the LOW level, the sampled data 1 differs from the sampled data 3. Thus, the sampled data 1 is compared with the sampled data 3 and, if these data differ from each other, a DOWN signal is output.

On the other hand, in the timing chart shown in FIG. 5, the sampled data 1 and the sampled data 3 are the same at all times. However, in case the serial data input pattern has transitioned from the LOW level to the HIGH level or from the HIGH level to the LOW level, the sampled data 2 differs from the sampled data 3. Thus, the sampled data 2 is compared with the sampled data 3 and, if these data differ from each other, an UP signal is output.

The phase controller 103 generates the phase control signal for the phase interpolator 104 and the phase control signal A for the phase interpolator A 105, based on the UP signal and the DOWN signal, output from the phase comparator 102.

Initially, the UP signals and the DOWN signals are counted by the up/down counter 103A. The up/down counter 103A counts up (+1) and counts down (−1) in case it has received the UP signal and the DOWN signal, respectively. When the count value has exceeded a preset value, the up/down counter increments the output phase control signal (+1), at the same time as it resets a count value to zero. When the count value has become smaller than the preset value, the up/down counter decrements the output phase control signal (−1), at the same time as it resets a count value to zero.

The adder 103B outputs the result of summation of the output signal of the up/down counter 103A (count value) and a phase offset signal output from the SERDES test control circuit 111.

The selection circuit 103C selects the output signal of the up/down counter 103A or the phase control signal for test output from the SERDES test control circuit 111.

The selection circuit 103D selects the signal output from the adder 103B or the phase control signal for test output from the SERDES test control circuit 111.

The phase interpolator 104 generates the extracted clock signal based on the phase control signal output from the phase controller 103.

Figure 6:
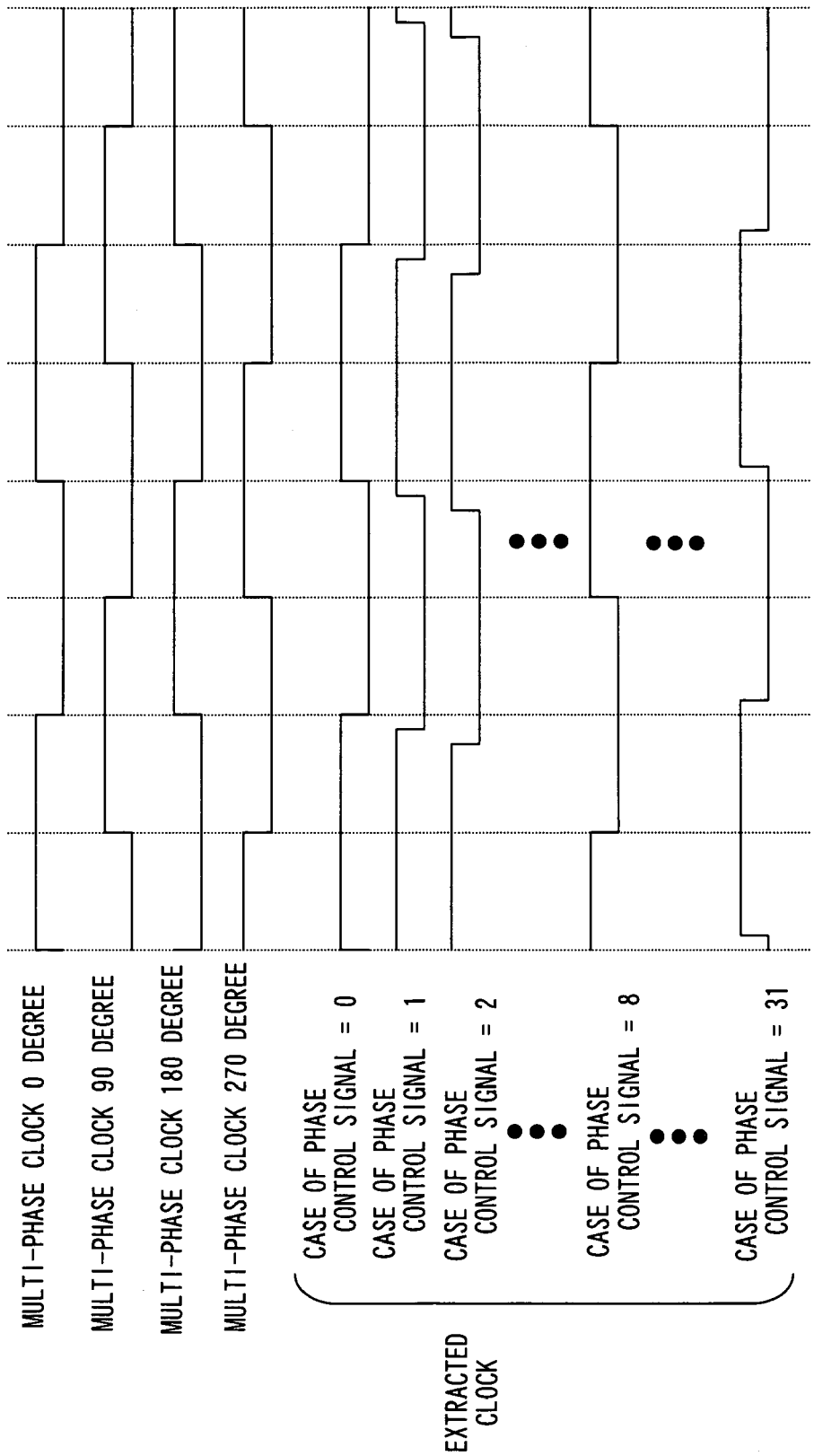
FIG. 6 is a timing chart for illustrating the operation of a phase interpolator according to the first embodiment of the present invention.

FIG. 6 is a timing chart showing an example of the operation of the phase interpolator 104. Specifically, FIG. 6 shows a case where a four-phase clock signals are received and the phase control signal may assume 32 values of from 0 to 31. As the phase control signal becomes larger, the extracted clock signal phase leads progressively. The phase control signal is varied cyclically, that is, when the value of the phase control signal is 31, the next phase is the phase control signal 0.

The operation of the phase interpolator A 105 is the same as that of the phase interpolator 104, except that the control signal in the phase interpolator A 105 is now a phase control signal A.

The threshold voltage generator 107 receives a threshold voltage control signal (digital signal), output from the SERDES test control circuit 111, and generates a high threshold voltage in case the threshold voltage control signal indicates a high value, while generating a low threshold voltage in case the threshold voltage control signal indicates a low value.

The data sampling circuit A 106 samples the serial input data 2, with the clock generated by the phase interpolator A 105, using the threshold voltage, generated by the threshold voltage generator 107, as a threshold level, in order to output the sampled data A.

The selection circuit 108 selects the sampled data, output from the data sampling circuit 101, or the sampled data A, output from the data sampling circuit A 106, and outputs the so selected data to the error detection circuit 110.

The selection circuit 109 selects the extracted clock signal, output from the phase interpolator 104, or the extracted clock signal A, output from the phase interpolator A 105, to output the so selected clock signal to the error detection circuit 110.

The error detection circuit 110 detects data error, using the data output from the selection circuit 108, and the clock signal output from the selection circuit 109, to output the result of detection to the SERDES test control circuit 111.

The above-described circuit of the first embodiment may carry out three sorts of the test operations (tests 1 to 3) under control by the SERDES test control circuit 111.

<Test 1>

In case the selection circuit 103C has selected the output of the up/down counter 103A, the extracted clock signal is generated, for the serial input data, by the operation of a loop of the data sampling circuit 101, phase comparator 102, up/down counter 103A and the phase interpolator 104. The data sampling circuit 101 samples the data, using the so generated extracted clock signal. The foregoing is the operation inherent to the clock and data recovery circuit.

In case the selection circuit 103D has selected the output of the adder 103B, the data sampling circuit A 106 carries out data sampling, in accordance with the clock signal shifted in time from the extracted clock signal by an amount corresponding to the phase as specified by the output phase offset signal from the SERDES test control circuit 111, and in accordance with the threshold level as specified by the output threshold voltage control signal from the SERDES test control circuit 111. The error detection circuit 110 detects an error in the sampled data.

Figure 7:
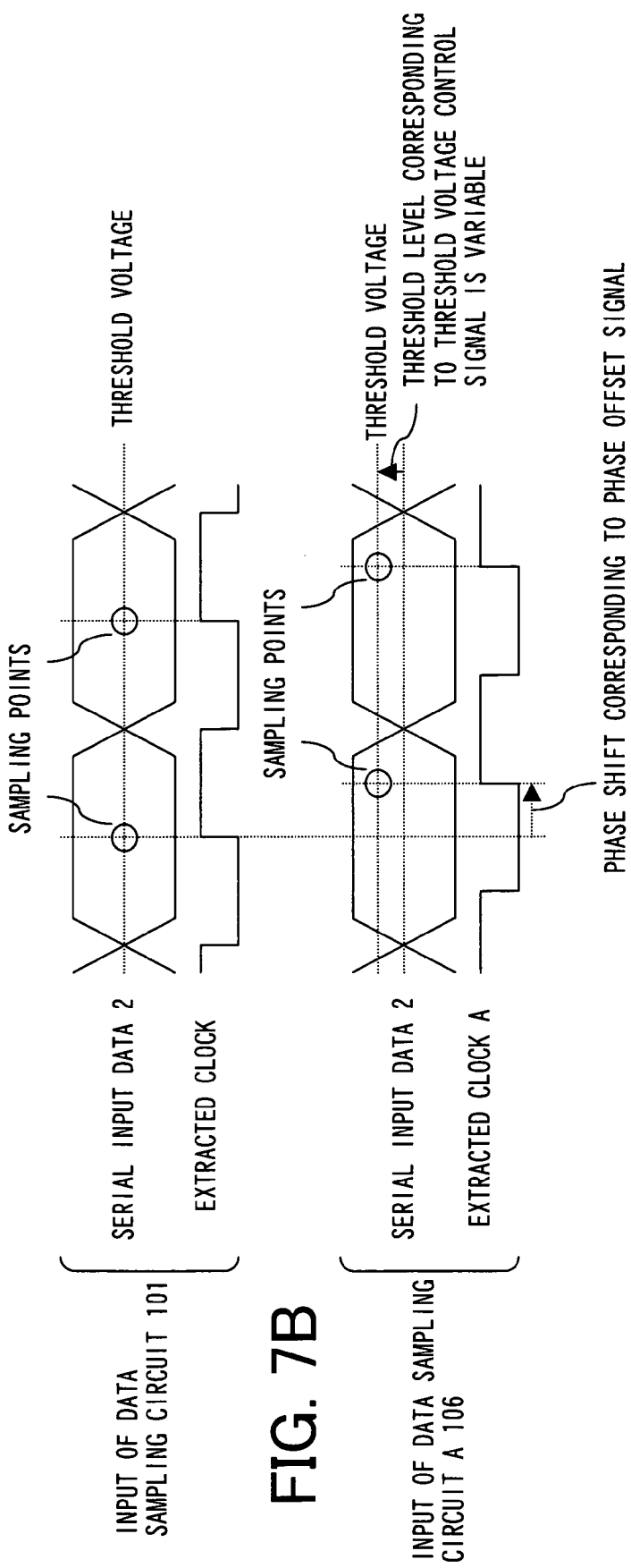
FIGS. 7A and 7B are diagrammatic views for illustrating the operation of a data sampling circuit and a data sampling circuit A in the first embodiment of the present invention.

FIGS. 7A and 7B show the relationships between the clock signal and the threshold voltage level of the data sampling circuit 101 and the data sampling circuit A 106. In the data sampling circuit 101, the threshold voltage level is made constant. In the data sampling circuit A 106, the threshold voltage level is varied with respect to the threshold voltage level of the data sampling circuit 101 in an amount prescribed by the threshold voltage control signal.

It is possible to check for possible presence of errors for various combinations of the phase offset signals and the threshold voltage control signals and to plot an eye pattern representing the operational margin for the clock and data recovery circuit, in order to measure the operational margin.

<Test 2>

In case the selection circuit 103D has selected the phase control signal for test, output from the SERDES test control circuit 111, the data sampling circuit A 106 samples data in accordance with a clock signal, having various clock phases, and a threshold level specified by a threshold voltage level as specified by the threshold voltage control signal output from the SERDES test control circuit 111. The error detection circuit 110 detects an error in the sampled data.

Figure 8:
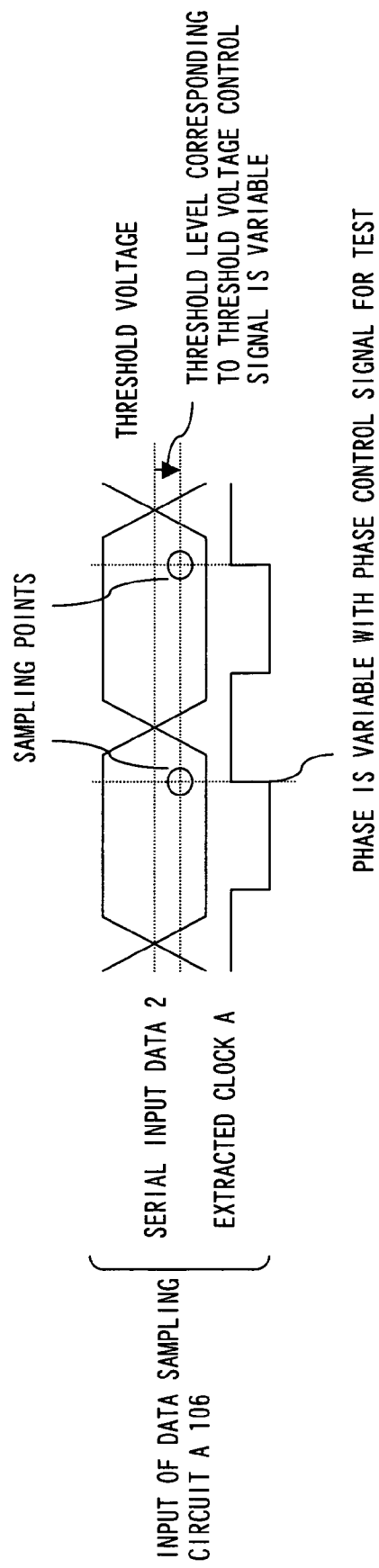
FIG. 8 is a diagram for illustrating the operation of a data sampling circuit A in the first embodiment of the present invention.

FIG. 8 shows the relationship between the clock and the threshold voltage level in the data sampling circuit A 106. It is possible to check for possible presence of errors for various combinations of the phase control signals for test and the threshold voltage control signals and to plot an eye pattern for the clock and data recovery circuit. The so plotted eye pattern may be compared later with the phase control signal at such time when the loop of the clock and data recovery circuit is in operation, in order to measure the operational margin of the clock and data recovery circuit.

<Test 3>

In case the selection circuit 103C has selected the phase control signal for test, output from the SERDES test control circuit 111, the data sampling circuit 101 samples the data using the extracted clock signal having various phases.

The error detection circuit 110 detects an error in the sampled data by the data sampling circuit 101.

Figure 9:
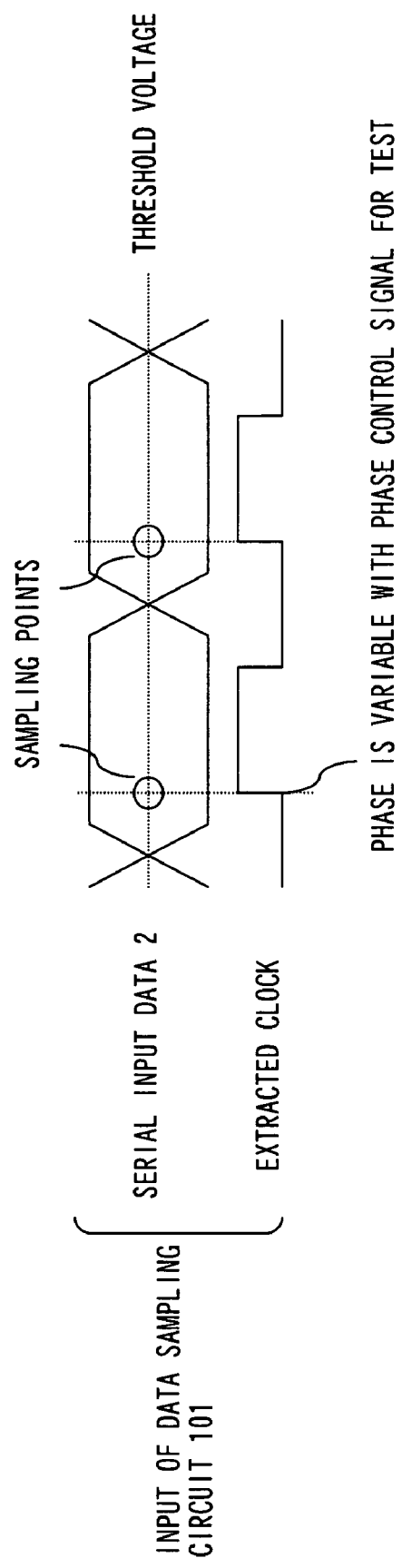
FIG. 9 is a diagram for illustrating the operation of a data sampling circuit in the first embodiment of the present invention.

FIG. 9 shows the state of the clock of the data sampling circuit 101. It is possible to check for possible presence of errors for a variety of phase control signals for test and to plot an eye pattern only for the time axis direction for the clock and data recovery circuit. The so plotted eye pattern may be compared later to the phase control signal at such time when the loop of the clock and data recovery circuit is in operation, in order to measure the operational margin of the clock and data recovery circuit.

In the present embodiment, the SERDES test control circuit 111 exercises the above control during testing.

Figure 10:
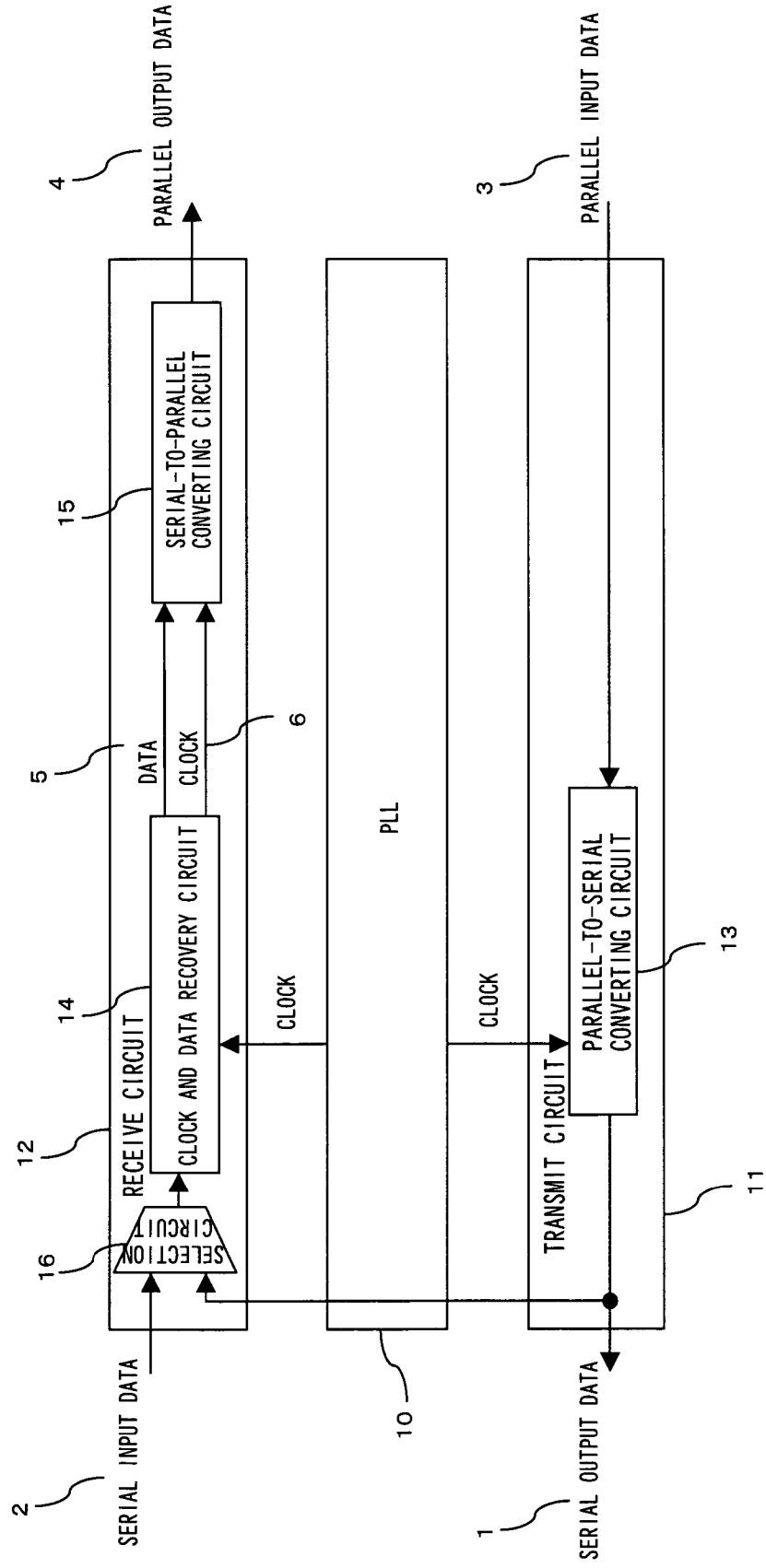
FIG. 10 is a block diagram showing the configuration of a SERDES circuit according to a second embodiment of the present invention.

A second embodiment of the present invention will now be described with reference to the drawings. FIG. 10 is a block diagram showing the overall configuration of the SERDES circuit according to the second embodiment of the present invention. In the previous embodiment, serial data are supplied from outside in order to carry out a test for the clock and data recovery circuit. In the present embodiment, a selection circuit 16 is provided ahead of the clock and data recovery circuit 14 to supply the output signal of the transmit circuit 11 in the SERDES circuit to one of the inputs of the selection circuit 16.

Meanwhile, a test pattern generating circuit, not shown, is provided in the transmit circuit 11 to generate a data pattern in order for the error detection circuit 110 to detect a possible error. With this configuration, the clock and data recovery circuit 14 can be tested in accordance with a loopback system without the necessity of supplying serial input data from outside. With the present embodiment, a high-speed SERDES circuit, having a transfer rate exceeding one GHz, can be subjected to a margin test (test for operational margin), employing the functional testing, without the necessity of using e.g. a high-speed tester.

FIG. 11 is a schematic circuit diagram showing a clock and data recovery circuit (14 of FIG. 1 or 10) according to a third embodiment of the present invention. In the previous first embodiment, the sampled data or the sampled data A is supplied as input to the error detection circuit 110, thus entailing a high-speed operation of the error detection circuit 110.

In the present embodiment, a serial-to-parallel converting circuit 15 is arranged ahead of the error detection circuit 110. In other respects, the present embodiment is the same as the embodiment shown in FIG. 2. The serial-to-parallel converting circuit 15 receives the serial data and the clock signal, output from the selection circuits 108 and 109, to convert the serial data into parallel data. The error detection circuit 110 receives the parallel data from the serial-to-parallel converting circuit 15 to detect a possible error in the data. With this configuration, it is unnecessary for the error detection circuit 110 to operate at an elevated speed. In the case of N-bit parallel operation, for example, it is sufficient that the error detection circuit 110 operates at a frequency equal to 1/N of that used in processing N-bit serial data.

Figure 12:
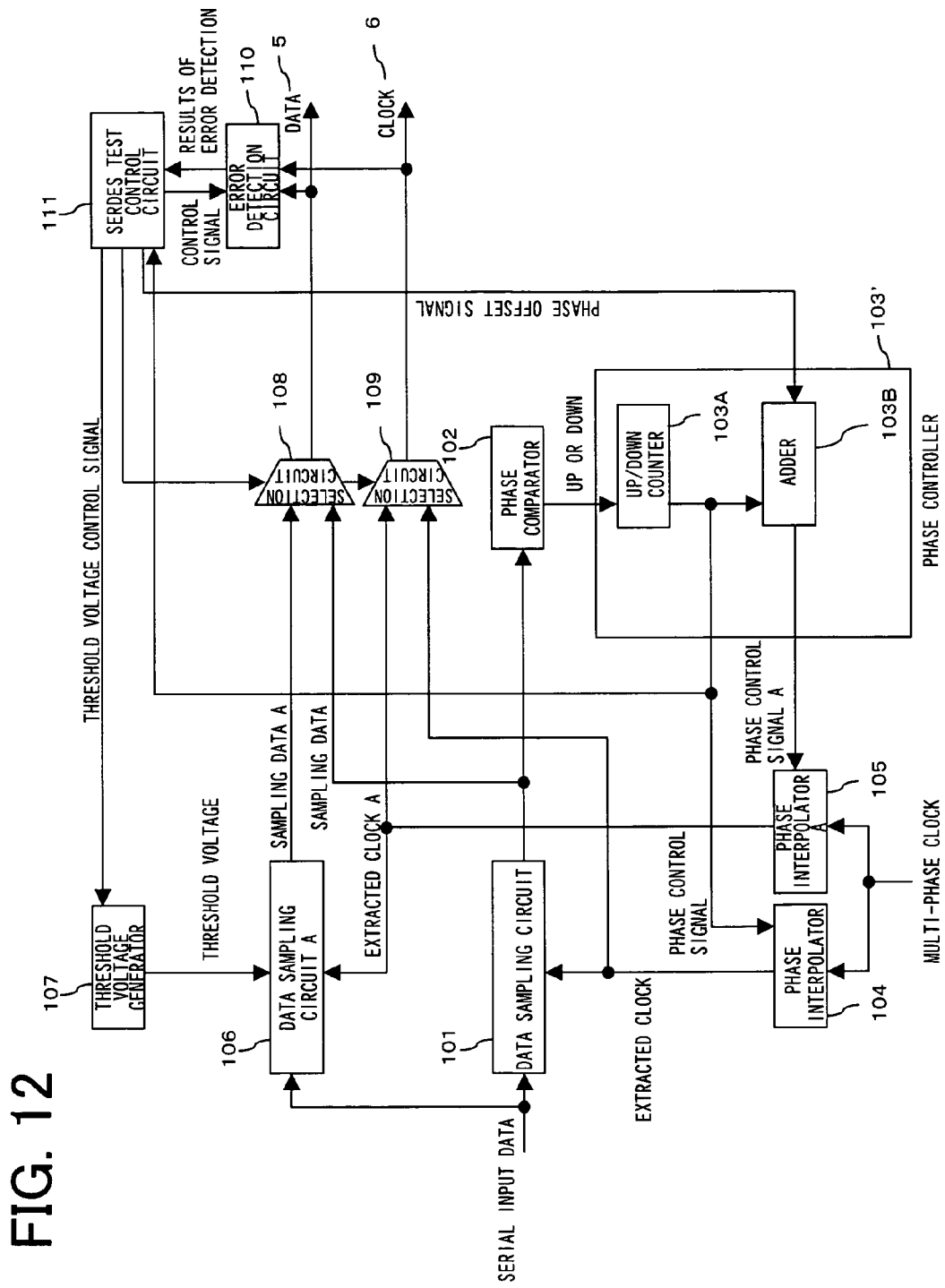
FIG. 12 is a block circuit diagram showing the configuration of a clock and data recovery circuit according to a fourth embodiment of the present invention.

FIG. 12 is a schematic circuit diagram showing a clock and data recovery circuit (14 of FIG. 1 or 10) according to a fourth embodiment of the present invention. In the previous first embodiment, all of the three sorts of tests, that is, <test 1> to <test 3>, may be carried out, as described above. However, if only the test 1 is to be carried out, the configuration of FIG. 12 suffices, and hence the configuration may be simplified. In the present embodiment, the selecting circuits 103C, 103D of the phase controller 103 of the first embodiment (FIG. 2) are omitted from the phase controller 103, as shown in FIG. 12.

The SERDES test control circuit 111 outputs a phase offset signal to a phase controller 103', without outputting a phase control signal for testing. The phase controller 103' includes an up/down counter 103A and an adder 103B for summing the phase offset signal from the SERDES test control circuit 111 to the count value from the up/down counter 103A. The phase controller 103' outputs a count value of the up/down counter 103A and the count value of the adder 103B, as phase control signal and as phase control signal A, to the phase interpolators 104, 105, respectively.

FIG. 13 shows the configuration of the clock and data recovery circuit (14 of FIG. 1 or 10) according to a fifth embodiment of the present invention. If only the test 3 is to be conducted, the configuration shown in FIG. 13 suffices, thus simplifying the configuration.

In an embodiment shown in FIG. 13, the data sampling circuit A 106, threshold voltage generator 107 and the selection circuits 103D, 108 and 109 are deleted from the configuration shown in FIG. 2. A phase controller 103" includes a selecting circuit 103C for selecting the phase control signal for test from the SERDES test control circuit 111 or the count value of the up/down counter 103A. The error detection circuit 110 receives the data from the data sampling circuit 101 and the extracted clock signal from the phase interpolator 104 to detect a possible error.

FIG. 14 is a schematic circuit diagram showing a clock and data recovery circuit (14 of FIG. 1 or 10) according to a sixth embodiment of the present invention. If the function of varying the threshold voltage level of the data sampling circuit 101 in an up-and-down direction is to be implemented, and only the tests 2 and the test 3 are to be carried out, as described above in the first embodiment, the configuration may be simplified, as shown in FIG. 14. In the present embodiment, the phase interpolator A 105, data sampling circuit A 106 and the selectors 103D, 108 and 109 are deleted from the configuration of FIG. 2. The phase controller 103''' includes an up/down counter 103A and a selection circuit 103C. The selection circuit 103C supplies an output signal of the up/down counter 103A or a phase control signal for test from the SERDES test control circuit 111 as a phase control signal to the phase interpolator 104. The data sampling circuit 101 receives the threshold voltage of the threshold voltage generator 107.

Figure 15:
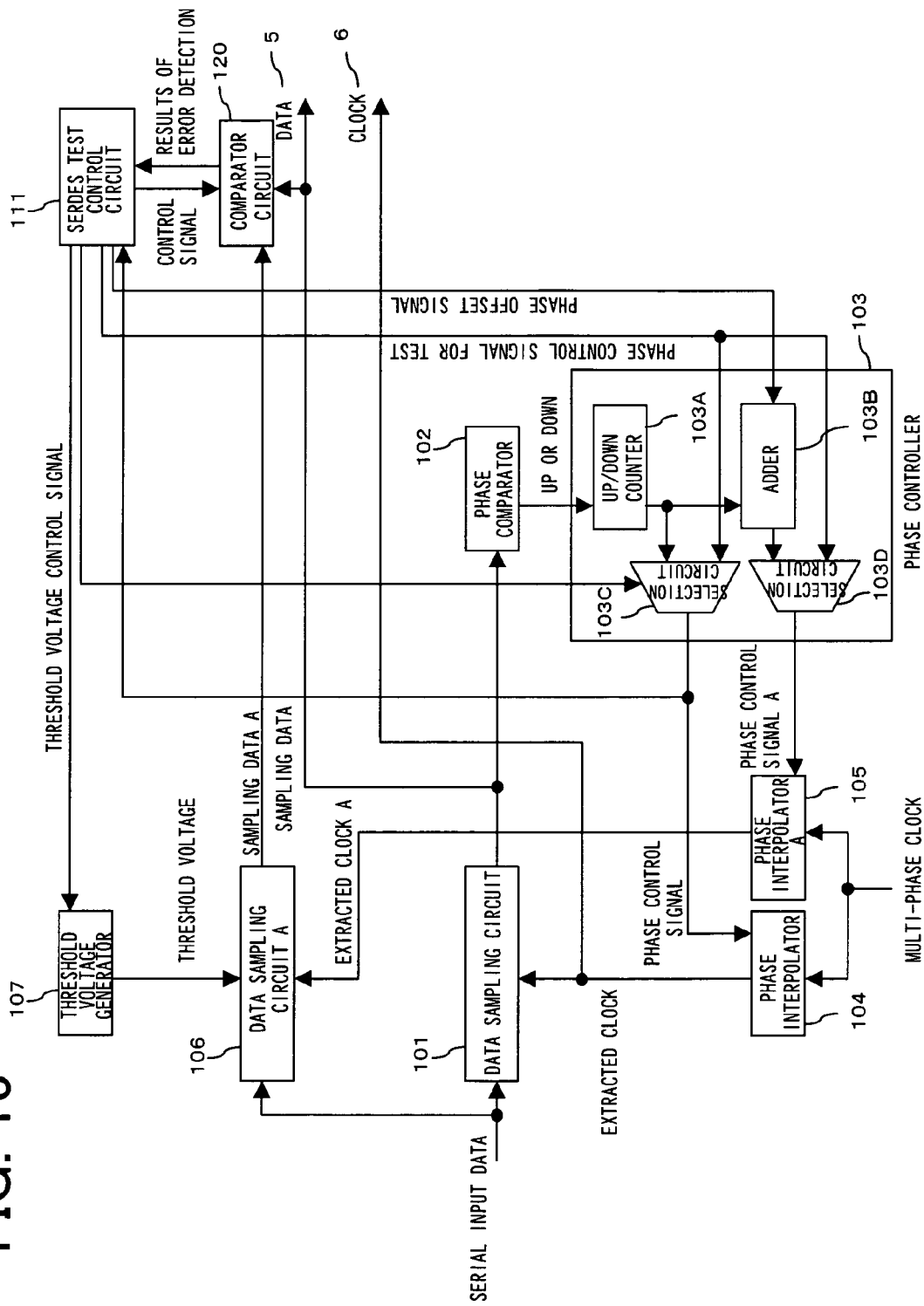
FIG. 15 is a block circuit diagram showing the configuration of a clock and data recovery circuit according to a seventh embodiment of the present invention.

FIG. 15 is a block diagram showing the configuration of a clock and data recovery circuit (14 of FIG. 1 or 10) of a seventh embodiment of the present invention. If only the test of <test 1> of the first embodiment is to be carried out, the configuration may be simplified, as shown in FIG. 15. Referring to FIG. 15, the present embodiment includes a comparator circuit 120 in place of the selection circuits 108, 109 and the error detection circuit 110. Otherwise, the present embodiment is the same as the above-described first embodiment.

The comparator circuit 120 receives the sampled data and the sampled data A from the data sampling circuit 101 and the data sampling circuit A 106, respectively, and compares these to each other. The comparator circuit gives a decision that, if the two data are coincident with each other, the sampled data A is correct, and that, if otherwise, the sampled data A is in error.

In this manner, it is unnecessary to be supplied with a dedicated data pattern for testing the clock and data recovery circuit 14. Moreover, the loop made up of the data sampling circuit 101, phase comparator 102, up/down counter 103A and the phase interpolator 104 may be operated, so that it becomes possible to test the clock and data recovery circuit in a normal operating state.

The aforementioned three tests will now be described with reference to specified examples. It is noted that tests may be conducted for the configuration shown in FIG. 1 or 10, whichever is desirable.

Example 1

Figure 16:
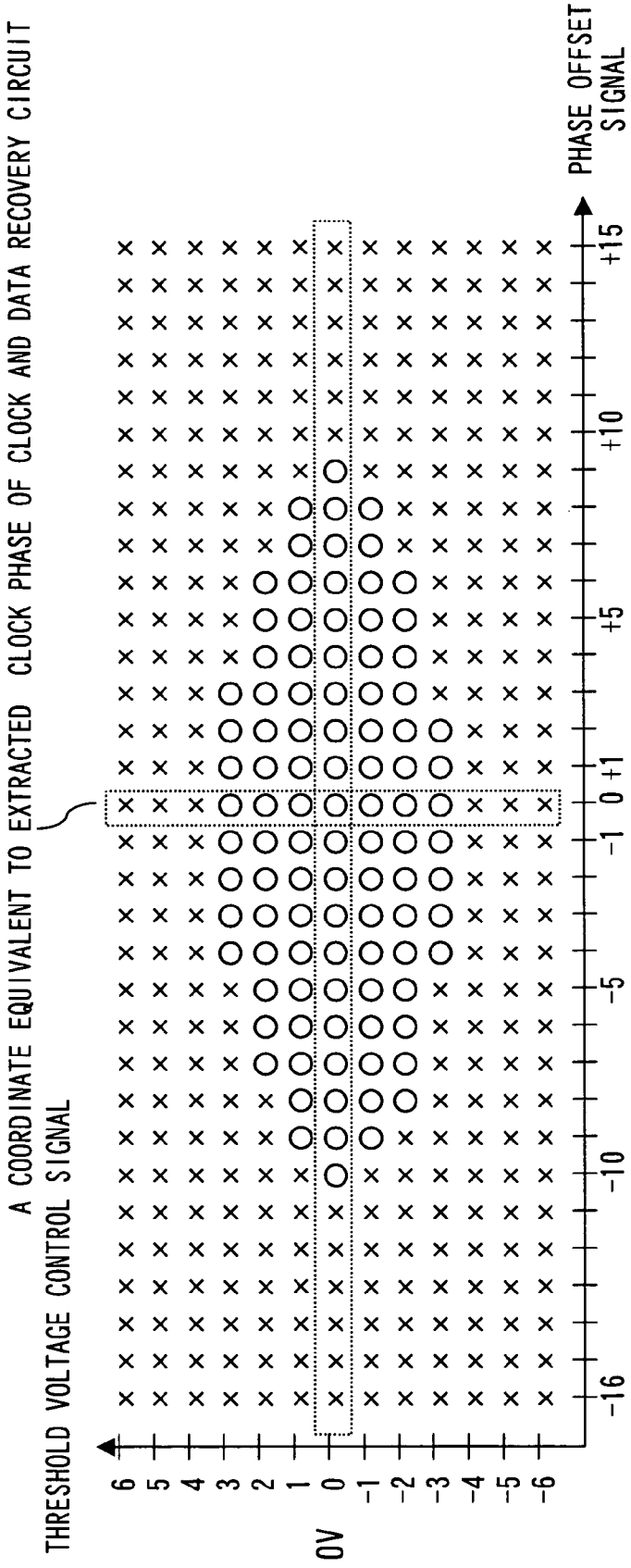
FIG. 16 is a view for illustrating the operation of the clock and data recovery circuit according to the first embodiment of the present invention.

FIG. 16 shows an example of an eye pattern obtained on plotting the result of error detection with the error detection circuit 110 for the case wherein various combinations of the phase offset signal and threshold voltage control signal are output from the SERDES test control circuit 111 in connection with the <test 1>. In FIG. 16, the abscissa and the ordinate denote the phase offset signal and the threshold voltage control signal, respectively. In FIG. 16, a circle mark denotes no error and a mark x denotes an error.

In case the time corresponding to 1 bit of the serial input data is equal to time corresponding to 32 divisions of from 0 to 31, it is sufficient to set 32 phase offset signals of from −16 to +16 as the phase offset signal. The X-coordinate 0 in the horizontal direction represents the phase of the extracted clock signal when the loop of the clock and data recovery circuit is in a normal operating state.

It is assumed that in-phase and reverse phase differential signals are received as the serial input data. Based on this assumption, the threshold voltage of the data sampling circuit 101 is set to 0V so that the zero Y coordinate in the vertical direction denotes the threshold value of 0V. The threshold voltage control signal is plotted above and below the 0V of the threshold voltage as center.

In FIG. 16, a point corresponding to zero X- and Y-coordinate values is coincident with a point being sampled by the data sampling circuit 101, so that, by checking how many consecutive circle marks there are about the zero X-coordinate and the zero Y-coordinate, it becomes possible to verify the operational margin along the temporal and voltage directions of the clock and data recovery circuit.

Example 2

Figure 17:
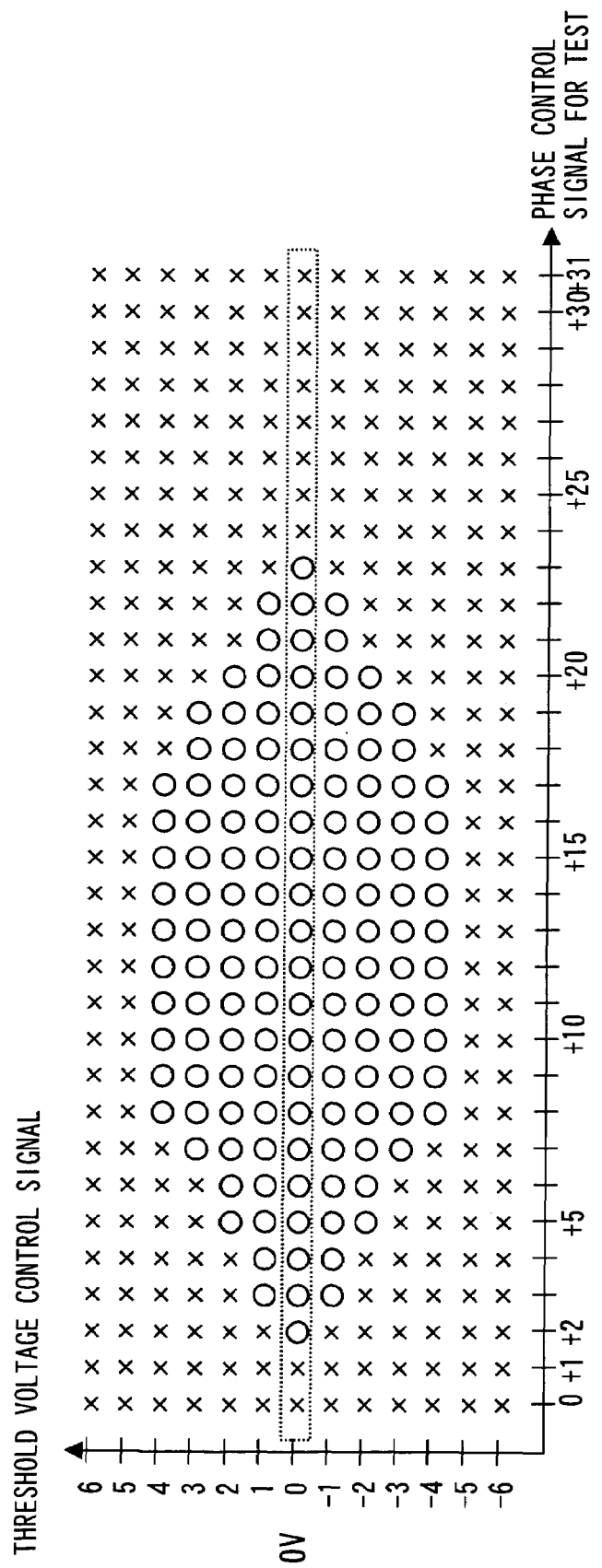
FIG. 17 is a view for illustrating the operation of the clock and data recovery circuit according to the first embodiment of the present invention.

FIG. 17 shows an example of an eye pattern obtained on plotting the results of error detection with the error detection circuit for the case wherein various combinations of phase offset signals and threshold voltage control signals are output from the SERDES test control circuit 111 in connection with the <test 2>. In FIG. 17, the abscissa and the ordinate denote the phase control signal for test and the threshold voltage control signal, respectively.

In FIG. 17, a circle mark denotes no error and a mark x denotes an error. In case the time corresponding to 1 bit of the serial input data is equal to time corresponding to 32 divisions of from 0~31~0, it is sufficient to set 32 phase offset signals of from 0 to +31 as phase control signal for test.

It is assumed that in-phase and reverse phase differential signals are received as the serial input data. Based on this assumption, the threshold voltage of the data sampling circuit 101 is set to 0V so that the zero Y coordinate in the vertical direction denotes the threshold value of 0V. The threshold voltage control signal is plotted above and below the 0V of the threshold voltage as center.

It is noted that the loop of the intrinsic clock and data recovery circuit, composed of the data sampling circuit 101, phase comparator 102, up/down counter 103A and the phase interpolator 104, may be run in operation before, after or during the formulation of the above plots. The values of the phase control signal in this case may then be verified and compared with the eye pattern, in order to decide the operational margin along the temporal and voltage directions of the clock and data recovery circuit.

For the phase control signal of 12, for example, there is margin of 10 coordinate values and 11 coordinate values towards left and right along the X-coordinate, respectively, and 4 coordinate values along both the upward and downward Y directions.

Example 3

Figure 18:
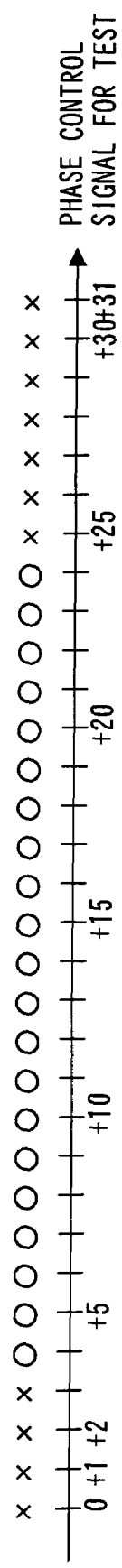
FIG. 18 is a view for illustrating the operation of the clock and data recovery circuit according to the first embodiment of the present invention.
Figure 19:
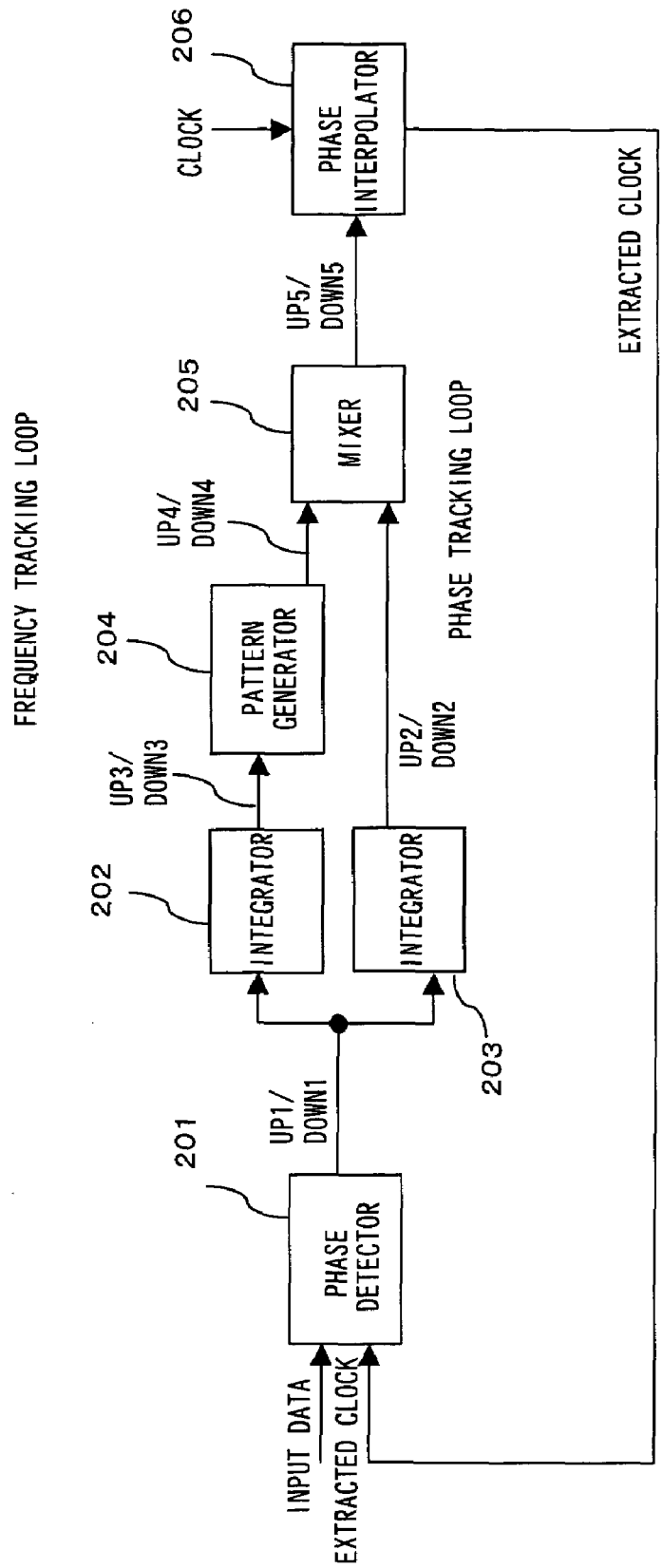
FIG. 19 is a block circuit diagram showing the configuration shown in Patent Document 1.

FIG. 18 shows an example of a one-dimensional eye pattern obtained on plotting the results of error detection with the error detection circuit for the case wherein various phase control signals for test are output from the SERDES test control circuit 111 in connection with the <test 3>. The abscissa of FIG. 18 denotes the phase control signals for test.

In FIG. 18, a circle denotes no error and x denotes an error. In case the time corresponding to 1 bit of the serial input data is equal to time corresponding to 32 divisions of from 0~31~0, it is sufficient to set 32 signals of from 0 to +31 as phase control signal for test.

It is noted that the loop of the intrinsic clock and data recovery circuit, composed of the data sampling circuit 101, phase comparator 102, up/down counter 103A and the phase interpolator 104 may be run in operation before or after the formulation of the above plots. The values of the phase control signal for such time may then be verified and compared with the eye pattern, in order to decide the operational margin along the temporal direction of the clock and data recovery circuit. It may be seen that, for the phase control signal of 14, for example, there is the margin of 10 coordinate values both towards left and towards right along the X coordinate axis.

Referring to FIGS. 1 to 18, the value of the operational margin may be calculated and compared with a preset value representing the desired operational margin. If the calculated value of the operational margin is greater than the preset value representing the desired operational margin, the clock and data recovery circuit being tested may be decided to be acceptable. If conversely the calculated value of the operational margin is smaller than the preset value, the clock and data recovery circuit being tested may be decided to be fail.

Meanwhile, it is assumed that, in the examples shown in FIGS. 16 to 18, the test time at each coordinate point may be set beforehand. On the other hand, in these examples, an error state and a no-error state are plotted in the respective plots. However, the number of errors may also be plotted, in which case it is possible to achieve more complex statistical processing.

As for the test 1, the test may be conducted only for several places around the point of origin, corresponding to the zero X-coordinate and the zero Y-coordinate, in order to provide for shorter test time. The coordinates of four points, spaced apart from the point of origin towards right, towards left, towards above and towards below, may be selected, from the desired operational margin, and testing may be conducted only for these four coordinate points, in order to verify that there is no error on the whole. By so doing, much shorter test time may be achieved.

According to the present invention, the possible presence of an error in the sampled data is detected at various different points, by the error detection circuit, in order to plot an eye pattern. Since the phase control signal when the loop of the clock and data recovery circuit is run in operation may be monitored by the SERDES test control circuit, the eye pattern, thus plotted, may be compared with the previous eye-patterns to measure the operational margin along the temporal and voltage directions of the clock and data recovery circuit.

According to the present invention, the phase control signal, specifying the sampling clock phase, of the data sampling circuit, may directly be specified from the SERDES test control circuit. In addition, the possible presence of an error in the sampled data A at various different points may be detected by the error detection circuit, and an eye pattern may be plotted only for the temporal direction of the clock and data recovery circuit. On the other hand, since the phase control signal when the loop of the clock and data recovery circuit is run in operation may be monitored by the SERDES test control circuit, the eye pattern, thus plotted, may be compared with the previous eye patterns, in order to verify the operational margin along the temporal direction of the clock and data recovery circuit.

Although the present invention has so far been explained with reference to the preferred embodiments, the present invention is not limited to the particular configurations of these embodiments. It will be appreciated that the present invention may encompass various changes or corrections such as may readily be arrived at by those skilled in the art within the scope and the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock and data recovery circuit comprising:
a data sampling circuit that receives an input data signal and samples the input data signal responsive to a clock signal;
a phase comparator that receives the data signal sampled by said data sampling circuit and detects the phase relationship between said clock signal and said data signal;
a phase controller that outputs a phase control signal based on the result of phase comparison by said phase comparator;
a phase interpolator that outputs a clock signal phase-interpolated based on said phase control signal;
said clock signal output from said phase interpolator being supplied to said data sampling circuit to form a loop; and
a control circuit that controls said phase control signal from outside said loop to exercise control for variably setting the phase of said clock signal supplied to said data sampling circuit and/or control for variably setting a threshold level in said data sampling circuit.

2. A SERDES circuit comprising:
a transmit circuit including a parallel-to-serial converting circuit that converts parallel data for transmission into serial data and outputs the resulting serial data; and
a receive circuit including a clock and data recovery circuit that receives the serial data and a serial-to-parallel converting circuit that receiving data and a clock signal output from said clock and data recovery circuit and converts the data into parallel data;
said clock and data recovery circuit being a clock and data recovery circuit as set forth in claim 1.

3. The SERDES circuit according to claim 2, further comprising:
a circuit controlled during testing in a switched fashion for looping back serial output data from said transmit circuit for supplying said serial output data to said clock and data recovery circuit of said receive circuit.

4. A clock and data recovery circuit comprising:
a data sampling circuit that receives an input data signal and samples the input data signal responsive to a clock signal;
a phase comparator that receives the data signal sampled by said data sampling circuit and detects the phase relationship between said clock signal and said data signal;
a phase controller that outputs a phase control signal based on the result of phase comparison by said phase comparator;
a phase interpolator that outputs a clock signal phase-interpolated based on said phase control signal;
said clock signal output from said phase interpolator being supplied to said data sampling circuit to form a loop;
said phase controller generating another phase control signal distinct from said phase control signal;
another phase interpolator that receives said another phase control signal output from said phase controller and generates a clock signal phase-interpolated based on said another phase control signal; and
another data sampling circuit that samples said input data based responsive to said clock signal output from said another phase interpolator.

5. The clock and data recovery circuit according to claim 4, wherein the threshold level of said another data sampling circuit in sampling said input signal is variably set.

6. The clock and data recovery circuit according to claim 4, further comprising:
- a test control circuit that generates a signal prescribing phase offset;
- said phase controller shifting said phase control signal by an amount corresponding to said phase offset to generate said another phase control signal.

7. The clock and data recovery circuit according to claim 4 further comprising:
- a test control circuit that generates a phase control signal for test;
- said phase controller generating said phase control signal and/or said another phase control signal from said phase control signal for test.

8. A clock and data recovery circuit comprising:
- first and second data sampling circuits that receive an input data signal and sample said input data signal responsive to first and second clock signals;
- a phase comparator that receives the data signal sampled by said first data sampling circuit and detects the phase relationship between said first clock signal and said data signal;
- a phase controller that receives the result of phase comparison by said phase comparator and outputs a first phase control signal;
- a phase interpolator that receives a multi-phase clock composed of a plurality of clock signals having phases spaced each another and supplies a clock phase-interpolated responsive to said first phase control signal, to said first data sampling circuit, as said first clock signal;
- a test control circuit that outputs a phase offset signal supplied to said phase controller and generates a threshold voltage control signal which is for variably controls a threshold voltage;
- a threshold voltage generating circuit that generates a threshold voltage responsive to said threshold voltage control signal;
- a second phase interpolator that receives said multi-phase clock and a second phase control signal from said phase controller and transmit a clock phase-interpolated responsive to said second phase control signal as said second clock signal to said second data sampling circuit;
- said second data sampling circuit having the threshold level variably set;
- a first selection circuit that selects data output from said first data sampling circuit or data output from said second data sampling circuits and outputs the selected data; and
- an error detection circuit that receives the data selected by said first selection circuit and detects an error in said data.

9. The clock and data recovery circuit according to claim 8, wherein, as a loop made up of said first data sampling circuit, phase comparator, phase controller and said phase interpolator is run in operation, it is checked by said error detection circuit whether or not data has been correctly sampled by said second data sampling circuit, for variable combinations of the phases between said first and second clock signals output by said first and second phase interpolators, respectively, and said threshold level, enabling the measurement of operational margin of said loop along the temporal direction and along the amplitude direction by plotting an eye pattern representing operational margin for said clock and data recovery circuit.

10. The clock and data recovery circuit according to claim 8, further comprising:
- a comparator, in place of said first selection circuit and said error detection circuit, said comparator receiving first and second data output from said first and second data sampling circuits, respectively, and comparing the received first and second data to each other in order to determine whether or not the first and second data coincide with one another.

11. The clock and data recovery circuit according to claim 8, further comprising:
- a second selection circuit that selects said first clock signal or said second clock signal;
- said test control circuit that receives the result of error detection from said error detection circuit and said phase control signal and generates a signal which is for controlling the selection in said first and second selection circuits.

12. The clock and data recovery circuit according to claim 8, wherein said test control circuit outputs a phase control signal for test;
said phase controller including:
- a counter that counts up or down based on a signal representing the result of comparison from said phase comparator;
- a selection circuit that selects an output of said counter or said phase control signal for test, based on said selection control signal from said test control circuit, and outputs the signal, thus selected, as said first phase control signal;
- an adder that adds an output of said counter and said phase offset signal together; and
- a selection circuit that selects an output of said adder or the phase control signal for test, based on a selection control signal from said test control circuit, and outputs the selected signal as said second phase control signal.

13. The clock and data recovery circuit according to claim 12, wherein, as a loop made up of said first data sampling circuit, phase comparator, phase controller and said phase interpolator is run in operation, said phase control signal for test is selected as said second phase control signal, and it is checked by said error detection circuit whether or not data has been correctly sampled by said second data sampling circuit, for variable combinations of the phases between said first and second clock signals output by said first and second phase interpolators, respectively, and said threshold levels, enabling the measurement of the operational margin of said loop along the temporal direction and along the amplitude direction by plotting an eye pattern representing the operational margin for said clock and data recovery circuit.

14. The clock and data recovery circuit according to claim 12, wherein said phase control signal for test is selected as said first phase control signal by said selection circuit and it is checked by said error detection circuit whether or not data has been correctly sampled by said first data sampling circuit, for various phases of said first clock signal output by said first phase interpolator to obtain an eye pattern, enabling the measurement of the operational margin of the clock and data recovery circuit along the temporal direction by comparing said eye pattern with clock phase information regarding said first clock signal output by said first phase interpolator;
said clock phase information being obtained by checking a phase of said first clock signal output by said first phase interpolator under a condition in which a loop made up of said first data sampling circuit, phase comparator, phase controller and said first phase interpolator is run in operation and said output of said counter is selected as said first phase control signal by said selection circuit.

15. The clock and data recovery circuit according to claim 8, wherein said error detection circuit detects the number of errors.

16. The clock and data recovery circuit according to claim 8, further comprising:
a serial-to-parallel converting circuit arranged in a preceding stage of said error detection circuit;
said error detection circuit being supplied with parallel data.

17. A clock and data recovery circuit comprising:
a data sampling circuit that receives an input data signal and for sampling the received signal;
a phase comparator that receives the data signal sampled by said data sampling circuit and detects the phase relationships between said clock signal and the data signal;
a phase controller that outputs a phase control signal;
a phase interpolator that outputs a clock signal, phase-interpolated based on said phase control signal from said phase controller;
said clock signal, output from said phase interpolator, being supplied to said data sampling circuit to form a loop;
a test control circuit that generates a phase control signal for test; and
an error detection circuit that receives the data signal output from said data sampling circuit and detects an error in the data signal;
said phase controller including a selection circuit selecting said phase control signal generated based on a signal representing the result of comparison by said phase comparator or said phase control signal for test, and outputs the signal selected as said phase control signal supplied to said phase interpolator.

18. The clock and data recovery circuit according to claim 17, further comprising:
a threshold voltage generator that receives a threshold voltage control signal variably controlling a threshold voltage, said threshold voltage control signal being output by said test control circuit, said threshold voltage generator variably outputting a threshold voltage;
said data sampling circuit sampling input data with said threshold voltage from said threshold voltage generator as a threshold level.

19. The clock and data recovery circuit according to claim 17, wherein said phase controller includes a counter that counts up or down based on the signal representing the result of comparison by said phase comparator; and
a selection circuit that selects and outputs an output of said counter or said phase control signal for test, based on a selection control signal from said test control circuit.

20. The clock and data recovery circuit according to claim 18, wherein said data sampling circuit includes a receiver circuit that receives said input data signal and has a threshold level variably set, and a set of latch circuits that sample an output of said receiver circuit at different timings based on a clock signal supplied to said data sampling circuit and an reversed-phase version of said clock signal, said data sampling circuit supplying a plurality of series of data sampled at different timings to said phase comparator;
said phase comparator detecting the phase lead or phase lag between said clock and the data based on the status of coincidence/non-coincidence between said plural series of data supplied from said data sampling circuit.

21. A clock and data recovery circuit comprising:
a data sampling circuit that receives an input data signal and samples the received input data signal responsive to a clock signal;
a phase comparator that receives the data signal sampled by said data sampling circuit and detects the phase relationship between said clock signal and said data signal;
a phase controller that outputs a phase control signal based on the result of phase comparison by said phase comparator;
a phase interpolator that outputs a clock signal phase-interpolated based on said phase control signal;
said clock signal output from said phase interpolator being supplied to said data sampling circuit to form a loop; and
a control circuit that monitors said phase control signal output from said phase controller in a state in which said loop is formed;
said control circuit including a circuit for controlling said phase control signal from outside said loop to exercise control for variably setting the phase of said clock signal supplied to said data sampling circuit and/or control for variably setting a threshold level in said data sampling circuit.

* * * * *